United States Patent
Gudan et al.

(10) Patent No.: US 9,680,533 B2
(45) Date of Patent: Jun. 13, 2017

(54) COMPUTATIONAL BLUETOOTH TAG WITH BACKSCATTER

(71) Applicants: Kenneth Gudan, Menlo Park, CA (US); Jonathan J. Hull, Menlo Park, CA (US)

(72) Inventors: Kenneth Gudan, Menlo Park, CA (US); Jonathan J. Hull, Menlo Park, CA (US)

(73) Assignee: RICOH CO., LTD., Tokyo (JP)

( * ) Notice: Subject to any disclaimer, the term of this patent is extended or adjusted under 35 U.S.C. 154(b) by 0 days.

(21) Appl. No.: 14/821,200

(22) Filed: Aug. 7, 2015

(65) Prior Publication Data
US 2016/0196455 A1    Jul. 7, 2016

Related U.S. Application Data

(60) Provisional application No. 62/099,357, filed on Jan. 2, 2015.

(51) Int. Cl.
| | |
|---|---|
| *H04B 5/00* | (2006.01) |
| *H04B 7/06* | (2006.01) |
| *H03L 7/099* | (2006.01) |

(52) U.S. Cl.
CPC ......... *H04B 5/0062* (2013.01); *H04B 5/0031* (2013.01); *H04B 7/0617* (2013.01); *H03L 7/0995* (2013.01)

(58) Field of Classification Search
CPC ........ B60C 11/24; G06K 9/66; G06K 7/0008; G06K 7/10059; G06K 19/0707; G06K 19/0712; G06K 7/10158; H03L 7/0995; H03L 7/148; H04B 5/0062; H04B 5/0031; H04B 7/0617

USPC ................................ 340/10.4, 10.5
See application file for complete search history.

(56) References Cited

U.S. PATENT DOCUMENTS

2008/0030306 A1*  2/2008  O'Toole ............... H03L 7/0995
                                                              340/10.4

OTHER PUBLICATIONS

Ensworth, Joshua F., et al. Every Smart Phone is a Backscatter Reader: Modulated Backscatter Compatibility with Bluetooth 4.0 Low Energy (BLE) Devices, 2015 IEEE International Conference on RFID (RFID), Apr. 15-17, 2015, pp. 78-85.

\* cited by examiner

*Primary Examiner* — Ali Neyzari
(74) *Attorney, Agent, or Firm* — Blakely, Sokoloff, Taylor & Zafman LLP

(57) ABSTRACT

A backscatter modulation radio-frequency (RF) sensor and method for using the same are disclosed herein. In one embodiment, the RF sensor comprises: an energy harvesting unit operable to convert incident RF energy to direct current (DC); a storage unit operable to store recovered DC power; one or more sensors for sensing; a backscatter communication interface to backscatter energy to communicate one or more packets using a frequency-shift keying (FSK) modulator; and a microcontroller coupled to the energy harvesting and storage units, the one or more sensors, and the backscatter communicator, the microcontroller operable to cause the backscatter communication interface to communicate sensed data from at least one of the one or more sensors while powered by energy previously harvested and stored by the energy harvesting and storage unit.

20 Claims, 16 Drawing Sheets

COMPUTATIONAL BLUETOOTH TAG WITH BACKSCATTER

PRIORITY

The present patent application claims priority to and incorporates by reference the corresponding provisional patent application Ser. No. 62/099,357, titled, "Computation Bluetooth with Backscatter," filed on Jan. 2, 2015.

FIELD OF THE INVENTION

Embodiments of the present invention relate to the field of radio-frequency (RF) communication; more particularly, embodiments of the present invention relate to devices that perform RF energy harvesting.

BACKGROUND OF THE INVENTION

Radio Frequency Identification (RFID) has existed for several decades now, and has experienced many different standards, applications, and interoperability and compatibility issues. However, the RFID EPC Gen2 standard, introduced in 2004, has become a unified standard across the industry.

RFID uses modulated backscatter. Modulated backscatter is a technique where a continuous wave radio frequency signal is essentially turned on and off (modulated) and reflected back to the receiver. The turning on/off is simply switching an RF switch which does not require very much power. It is similar to a flashlight generating the light (expensive), someone else flipping a mirror back and forth (inexpensive switch), and a third device looking at the reflections of the mirror to receive the message.

FIG. 1 illustrates a backscatter communication system. Referring to FIG. 1, device 1 generates the continuous wave signal. Device 2 is the tag, which modulates the signal with the intended data. Device 3 is the backscatter receiver, which reads the modulated signal and demodulates it into the original message from Device 2. In RFID, devices 1 and 3 are combined into the same physical device, but this is not required.

A key feature of RFID is that it is batteryless. An RFID tag harvests the incident energy that it is backscattering for communication, converts the energy to DC power, and stores the energy in a capacitor for use by the tag. In this way, there are no batteries required, and the tag functions as long as there is sufficient incident RF energy.

Bluetooth is a standard wireless communication interface that is over 10 years old. Bluetooth communicates in the 2.4 GHz ISM frequency band. Traditionally, WiFi 802.11 occupies much of this space, so Bluetooth has been designed to communicate in frequency sub-bands where WiFi is known to be less prevalent, and Bluetooth receivers are also designed to be sensitive to slight perturbations on the incoming signals due to competing RF communications standards in this space.

Bluetooth Version 4.0 is also known as Bluetooth Low Energy (BLE) or Bluetooth Smart. BLE takes the low-power feature of Bluetooth to a new level by reducing the pairing and communication requirements, therefore reducing the time the radio must be on. This new low-power standard has made BLE the wireless radio interface of choice for "Internet of Things" type communication systems. Battery powered sensor tags that communicate via BLE are very common. Moreover, BLE radio receivers are available on a wide variety of platforms that people carry around with them every day, including smartphones and tablets. Therefore, anyone with one of these devices can read devices which transmit BLE messages.

Advertising Packets

Any device can transmit BLE advertising packets, without pairing with a reading device. Advertising packets are only, and always, sent on all three of channels 37, 38, and 39. As a result, many sensor tags use advertising packets to transmit their sensed data, because the sensor can easily create such a packet and send it and shut down quickly, minimizing expensive radio-on time for the sensor tag. Meanwhile, receivers (actual BLE radio nodes) receive the advertisement, and appropriate software on the receiver (e.g., cellphone), can then act upon it.

Computational RFID

Computational RFID is a relatively new enhancement to the types of RFID devices that are supported. Traditionally, the data encoded into an RFID tag are permanently fixed bits that can represent an ID field and any other fixed distinguishing identifiers of the tag.

Computational RFID creates an RFID data field that can be changed. The data payload in computational RFID can include, for example, sensor data (temperature, humidity, pressure, etc.). The payload can be configured to include the current temperature, and the CRC checksum can be updated to account for the different bit fields. Computational RFID is gaining popularity because of this enhanced capability because it is more flexible than a fixed ID tag.

Computational Bluetooth

Computational Bluetooth expands upon BLE by proposing a practical system implementation of the same, and due to the nature of embedding sensed data in the payload, and using backscatter communications, it is similar to computational RFID.

SUMMARY OF THE INVENTION

A backscatter modulation radio-frequency (RF) sensor and method for using the same are disclosed herein. In one embodiment, the RF sensor comprises: an energy harvesting unit operable to convert incident RF energy to direct current (DC); a storage unit operable to store recovered DC power; one or more sensors for sensing; a backscatter communication interface to backscatter energy to communicate one or more packets using frequency-shift keying (FSK) modulation, wherein the backscatter communication interface comprises a frequency synthesizer, a multiplexer, and a RF switch, and further wherein outputs of the frequency synthesizer are coupled to inputs of a multiplexer and an output of the multiplexer is coupled to an input of the RF switch, the RF switch to output data for transmission; and a microcontroller coupled to the energy harvesting and storage units, the one or more sensors, and the backscatter communicator, the microcontroller operable to cause the backscatter communication interface to communicate sensed data from at least one of the one or more sensors while powered by energy previously harvested and stored by the energy harvesting and storage unit.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
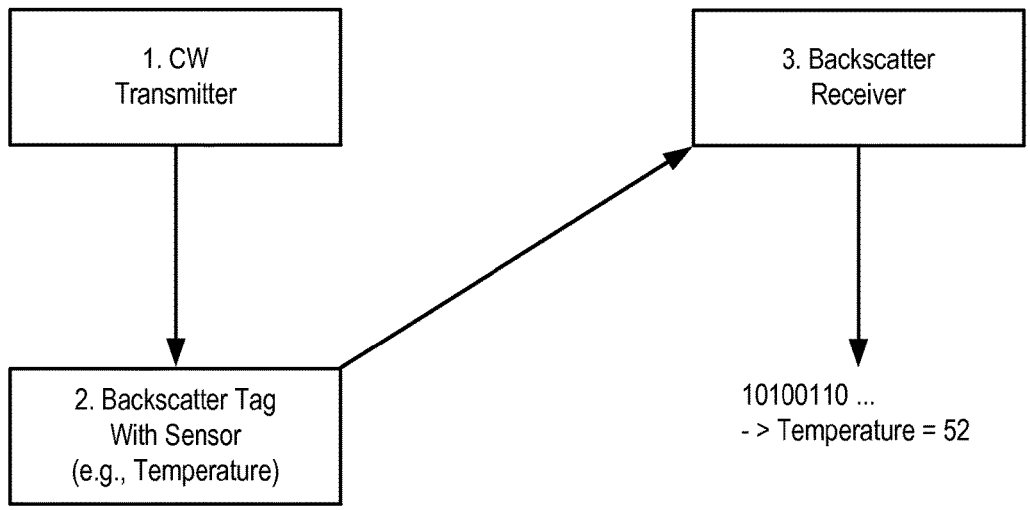
FIG. 1 illustrates one embodiment of a backscatter communications system.

A new method and apparatus for transmitting Bluetooth packets using backscatter communications is described. This communication technique enables ultra-low-power sensor tags, by reducing the energy required to communicate in some embodiments by a factor of 1000.

The disclosure that follows describes practical system implementations for modulated backscatter devices, including generation of the signals as well as overcoming multi-tag and configuration issues.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Overview

A communication system for performing low power communication using the Bluetooth Low Energy (BLE) protocol with the widely available standard of BLE advertising packets (or other Bluetooth packets) is described. In one embodiment, the system includes RF sensors and ID tags that communicate using a backscatter communication interface. In one embodiment, the communication system adds sensed data to the payload of these advertising packets to transfer the sensed data to other locations in the system.

Wireless communication can be WiFi (802.11), or possibly a backscatter communication (similar to RFID). In one embodiment, communication occurs in the 2.4 GHz band. However, in alternative embodiments, another band is used, such as, for example, 5.8 GHz. The 2.4 GHz band includes not only Wi-Fi, but also bands used by Zigbee, Bluetooth, and other handheld devices, and even emissions from microwave ovens.

In one embodiment, the RF sensors and ID tags perform energy harvesting. In one embodiment, the energy harvesting is in the 2.4 GHz frequency band. This is superior to other sources of energy harvesting (e.g., thermal, vibration, photovoltaic), because it is always present as people typically do not turn off their access points when they leave work at the end of the day. One problem is that the amount of energy available from WiFi is small (on the order of nW to uW). Therefore, a high-quality low-energy harvester for 2.4 GHz could be used by a sensor device to allow for a continuously sensing and communicating and never need maintenance.

Figure 2:
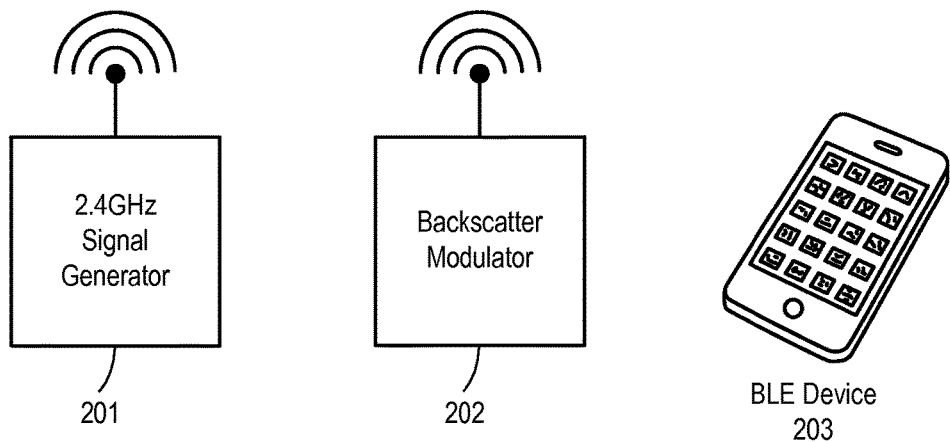
FIG. 2 illustrates one embodiment of a backscatter system.

In one embodiment, the RF sensor or tag transmits BLE advertising packets via backscatter communication. FIG. 2 illustrates one embodiment of a communication system with such a tag. Referring to FIG. 2, the system includes continuous wave signal generator 201, backscatter modulator 202, and a reader 203. Signal generator 201 and backscatter 202 form part of a backscatter communication interface. Signal generator 201 generates a continuous waveform that is modulated for transmission by backscatter modulator 202. In one embodiment, the backscatter interface communicates packets using frequency-shift keying (FSK) modulation. In such a case, modulator 202 is a FSK modulator.

In one embodiment, backscatter modulator 202 comprises an Agilent 33500B arbitrary waveform generator (Agilent Technologies Inc.) coupled to a radio-frequency (RF) switch (BF1108R from NXP Semiconductors). In one embodiment, reader 203 is a smart phone (e.g., iPhone, etc.), a tablet (e.g., an iPad, etc.), a personal digital assistant (PDA), a laptop or other portable computer, as well as a BLE packet sniffer.

Example System Implementations

Figure 3:
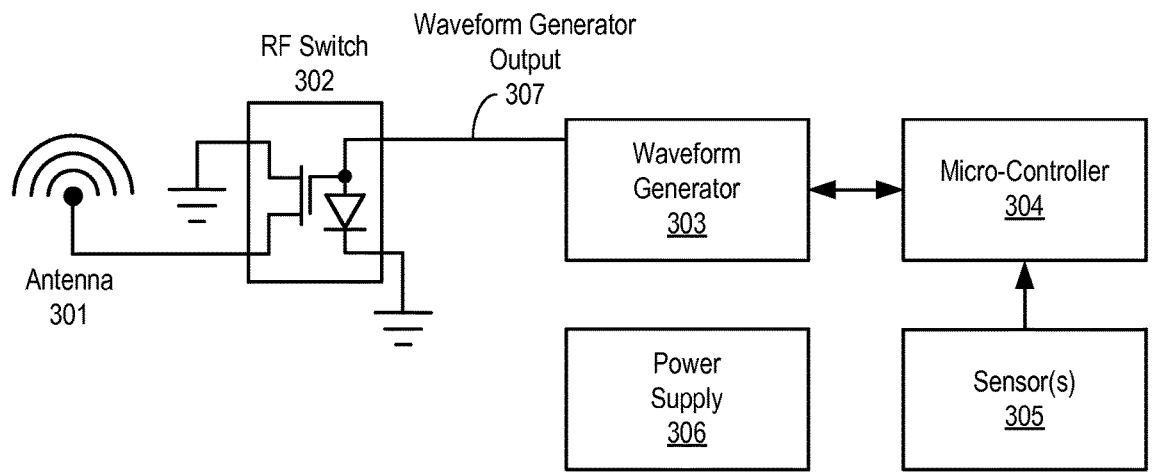
FIG. 3 illustrates one embodiment of a backscatter modulation sensor tag.

FIG. 3 is one embodiment of an RF backscatter modulation sensor tag. Referring to FIG. 3, the backscatter modulation is performed using antenna 301, RF switch 302, and waveform generator 303. Waveform generator 303 generates waveform generator output 307, which is coupled to be received by an input of RF switch 302. In one embodiment, waveform generator output 307 is coupled to an anode of a diode and a gate of a transistor in RF switch 302.

In one embodiment, the sensor tag is controlled using microcontroller 304. In one embodiment, the tag includes integrated sensor(s) 305 coupled to microcontroller 304 for sensing data. In one embodiment, the sensor tag includes a power supply 306 to supply power to components of the sensor tag.

Sensor Tag Power Supply

In one embodiment, power supply 306 for the sensor tag is a battery (e.g., replaceable rechargeable, or one-time use battery). However, this is not an ideal solution because there could be implementations where it is too expensive or impossible to replace the batteries once they are depleted. In one embodiment, the RF sensor tag includes an energy harvester, with energy storage, to perform energy harvesting in a source of energy for the tag.

The source of energy harvesting is not so important, so long as the duty cycle energy requirements of the tag are lower than the amount of energy being harvested. Energy sources can include photovoltaic, vibration, thermal, and even radio frequency harvesting. RFID is completely self-powered by harvesting the incident RF energy that is also used in the modulation.

In one embodiment, the energy for this tag is stored in a capacitor (such as in the RFID case). In another embodiment, the energy for the tag is charged into a rechargeable battery.

Sensor Tag Sensors

The sensor tag includes one or more sensors. In one embodiment, the only limit is the power consumption of the sensors and the physical size of the tag for the target application. In one embodiment, the tag includes temperature and/or light sensors, which are very low-power and easy to integrate. In one embodiment, pressure and/or humidity sensors are included in the tag. In one embodiment, these sensors usually require configuration over a digital control bus, and therefore require slightly more power, but also offer more benefits of sensed information. In yet another embodiment, the tag includes one or more gas sensors. In still another embodiment, one or more of audio, RF, and even ultra-low-power image sensors are included in the tag.

Sensor Tag Microcontroller

In one embodiment, microcontroller 304 is both inexpensive and very low-power. Microcontroller 304 causes sensors 305 to sense the data and stores/communicates that sensed data when necessary. In one embodiment, microcontroller 304 also generates a digital version of the waveform that will be used for the waveform modulation and backscatter communication (sending the BLE advertising packet).

In one embodiment, microcontroller 304 is asleep, or even off, most of the time, wakes up at pre-determined intervals (by, for example, either an on-board or an off-chip ultra-low power real time counter (RTC)), or by pre-determined events (e.g., a sensor exceeding a pre-set threshold), and takes the sensed reading. Microcontroller 304 stores this reading in a memory (separate from or within microcontroller 304), creating a log file for use later, or alternatively immediately communicates this reading via the BLE interface. In one embodiment, if the sensed data is stored in a memory, the memory must either be non-volatile, or the tag must have a continuous source of power (either battery or a constant source of harvestable power) until the data is eventually communicated to the BLE interface.

Options for microcontroller 304 operation depend on the power supply system used. In one embodiment, if the power storage is only a capacitor that is charged when there is incident continuous wave (CW) power available for harvesting, microcontroller 304 backscatters the sensor data as soon as it has read sensors 305, because the CW power may not be available 100% of the time. In another embodiment, if the power supply system is a rechargeable battery, microcontroller 304 wakes up, reads the sensors, and stores the data in a log (memory), without any communications, and all under battery power. Then, when incident CW RF energy is detected, the battery can be re-charged (or re-charged by any of the other ambient energy sources mentioned above), and the entire log can be communicated by microcontroller 304 via one or several BLE advertising packet messages (or other Bluetooth messages).

Examples of Backscatter Modulation Implementations

In one embodiment, the sensor tag includes an extremely low power backscatter communications interface.

Details about the actual process of modulating the CW energy, such as, for example, which modulation frequencies to use and why and creating the actual advertising packet, are well-known in the art and are not described herein. In one embodiment, the following frequencies are optionally transmitted to the RF switch for modulation to create the backscatter signal: 25.35 MHz, 25.65 MHz, 26.7 MHz, and 27.3 MHz. The RF switch switches on and off at these rates to modulate the incident CW energy.

A bit-time in Bluetooth is 1 usec, and typical advertising packets can be 232 bits long (29 bytes), so the total backscatter modulation requires 232 usec to communicate. Across three advertising channels, the total message transmission time is <1 msec (allowing for small gap periods between the channels).

PLL and RF Multiplexer

For each channel, in one embodiment, either the upper sideband or lower sideband of the frequency is used to transmit either a logic "1" or logic "0" through frequency shift keyed modulation. Therefore, for each channel, in one embodiment, only two frequencies are used. Because the stabilization time for waveform generation can often be up to 10 msec, it is easier to stabilize the two frequencies at the same time and switch between them (rather than try to quickly stabilize one all the time), allowing the RF switch to modulate (communicate) the various bit parameters.

Figure 4:
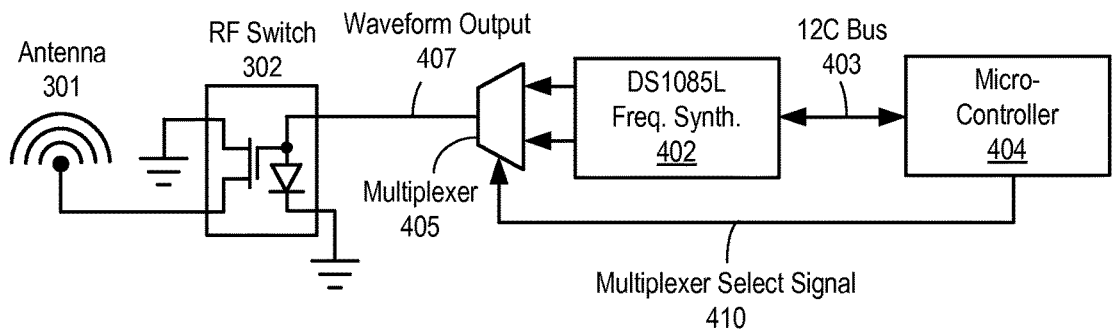
FIG. 4 is a block diagram of one embodiment of a backscatter communication interface.

FIG. 4 is a block diagram of one embodiment of a backscatter communication interface having a multiplexer and a frequency synthesizer unit that generates two waveforms at two different frequencies. Referring to FIG. 4, multiplexer 405 provides a single, waveform output 407, to an input of RF switch 302. In one embodiment, waveform output 407 is coupled to an anode of a diode and a gate of a transistor in RF switch 302. The signal output from multiplexer 405 is selected from one of its inputs, which are coupled to outputs from frequency synthesizer 402 (e.g., DS108SL of Dallas Semiconductor, purchased by Maxim Integrated™). The selection is based on a multiplexer select signal 410 from microcontroller 404. In one embodiment, microcontroller 404 communicates with frequency synthesizer 402 via I2C bus 403.

In one embodiment, a Maxim Integrated™ Dallas Semiconductor DS 1085L frequency synthesizer integrated circuit (IC) is used to generate the waveforms. It doesn't require any external components, and generates two frequencies once configured. In another embodiment, the frequency synthesizer is a CS2000-CP from Cirrus Logic (a dual-output synthesizer in this frequency class). In still another embodiment, the frequencies can be generated from individual oscillators, VCXOs, or any other kind of frequency generation source. In one embodiment, at least two are required to obtain the upper and lower sideband of the modulation frequency required. There are a number of RF multiplexers 405 that can be used. Some examples are the OPA875 video multiplexer from Texas Instruments Incorporated, or the ADG904 from Analog Devices, Inc. (a 4:1 RF multiplexer).

Figure 15:
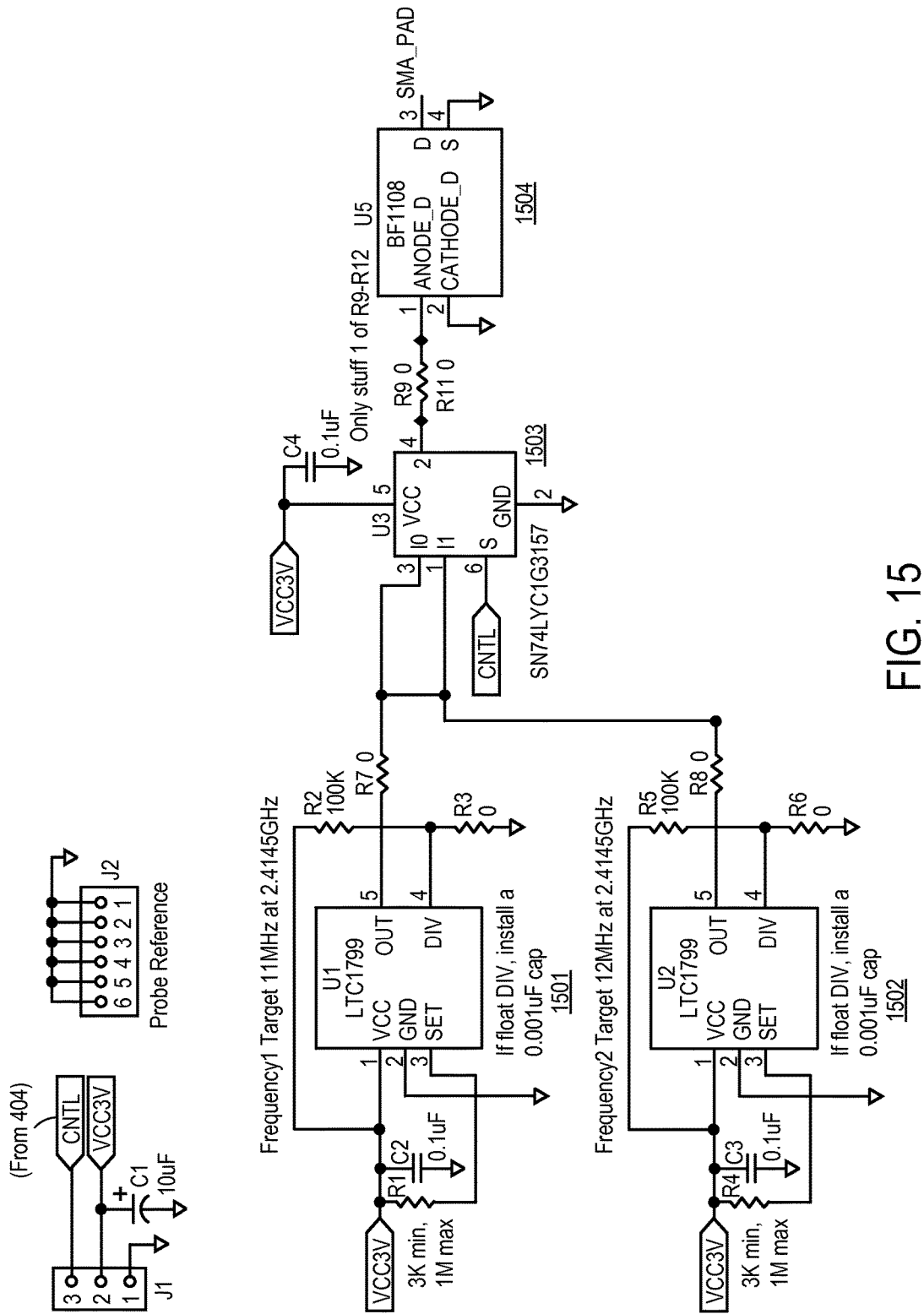
FIG. 15 is a circuit schematic of one embodiment of a frequency shift key waveform generator for a backscatter communication interface.

FIG. 15 is a circuit schematic of one embodiment of a waveform generator for a backscatter communication interface. The circuit of FIG. 15 is used to implement frequency synthesizer 402 and multiplexer 405 in FIG. 4. Referring to FIG. 15, the waveform generator comprises two frequency synthesizers 1501 and 1502. In one embodiment, frequency synthesizers 1501 and 1502 are a LTC® 1799 oscillator of Linear Technology Corporation. The frequency of each is configured via the size of a resistor coupled to its Set pin. For example, in one embodiment, frequency synthesizer 1501 is set at 11 MHz using resistor R1, while frequency synthesizer 1502 is set at 11 MHz using resistor R4. The outputs of both frequency synthesizers 1501 and 1502 are coupled to inputs of multiplexor (mux) 1503. In one embodiment, mux 1503 is implemented with a SN74LVC1G3157 switch of Texas Instruments Incorporated. The output of mux 1503 is coupled to an input of buffer 1504. In one embodiment, buffer 1504 is implemented with a BF1100 from NXP Semiconductor. In one embodiment, multiplexor 1503 is a bi-directional switch, and a simple pass-through buffer (not shown) between synthesizers 1501 and 1502 is used to boost the current to drive the signal through multiplexer 1503 properly.

In one embodiment, all four key frequencies mentioned above can be generated simultaneously, either via a 4-channel synthesizer, or two dual-channel synthesizers as defined above, or through four individual synthesizers. A 4:1 RF multiplexer 405 can be used to select the modulation rate of the RF switch 302.

The control signal from the microcontroller to the RF switch need only toggle at the Bluetooth bitrate (that is 1 usec period or 1 MHz frequency), not the modulation frequency or the carrier frequency, which is slow enough for almost any microcontroller to support.

Figure 16:
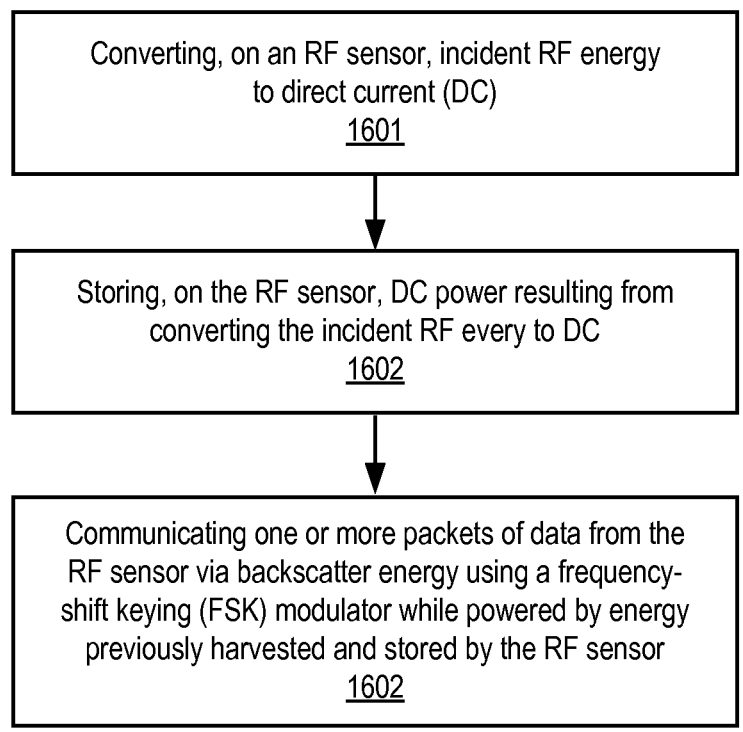
FIG. 16 is a flow diagram of one embodiment of a process for communicating via backscatter communication.

FIG. 16 is a flow diagram of one embodiment of a process for communicating via backscatter communication. The process is performed by processing logic that may comprise hardware (circuitry, dedicated logic, etc.), software (such as is run on a general purpose computer system or a dedicated machine), or a combination of both.

Referring to FIG. 16, the process begins by converting, on an RF sensor, incident RF energy to direct current (DC) (processing block 1601) and storing, on the RF sensor, DC power resulting from converting the incident RF energy to DC (processing block 1602).

Subsequently, processing logic communicates one or more packets of data from the RF sensor via backscatter energy using a frequency-shift keying (FSK) modulator while powered by energy previously harvested and stored by the RF sensor (processing block 1603). In one embodiment, the one or more packets comprise one or more BLE advertising packets. In one embodiment, communicating the one or more packets comprises generating an output waveform from a waveform generator; and modulating the continuous wave energy for backscatter communication using an RF switch.

PLL-Based Modulation

Figure 5:
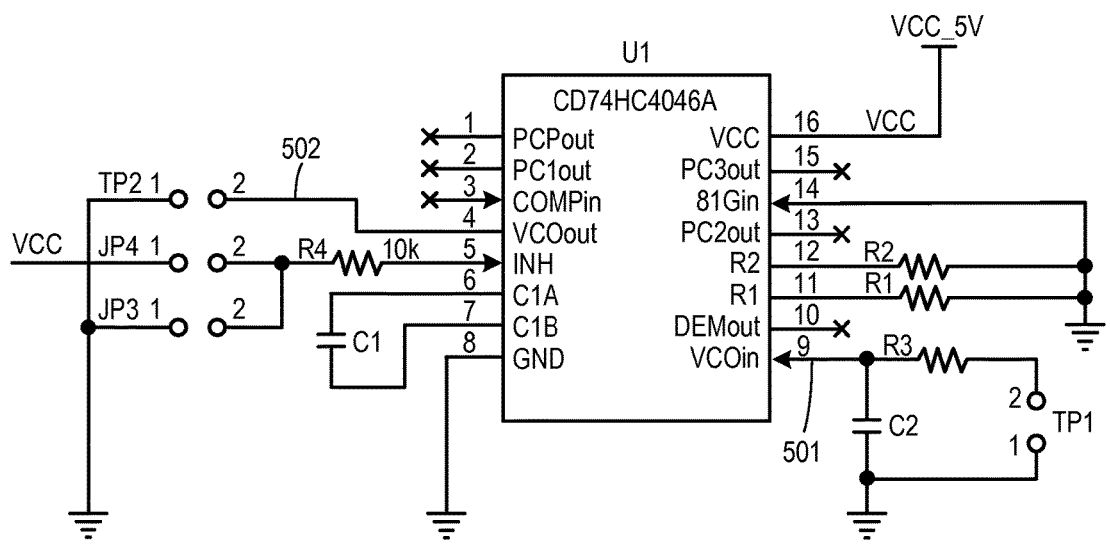
FIG. 5 is a schematic of one embodiment of frequency-shift key (FSK) modulator using a phase locked loop (PLL).

In another embodiment, a frequency shift keyed modulator is implemented using a high-speed PLL to quickly shift between two similar frequencies. For example, a whitepaper entitled "Implementation of FSK Modulation and Demodulation using CD74HC4046A," using by Texas Instruments Incorporated in November, 2013, illustrates the design of an FSK modulator with an HCT4046 PLL IC, which contains a VCO-PLL. This is shown in FIG. 5. More specifically, the VCO-PLL is substituted in FIG. 3 for waveform generator 303 or the combination of multiplexer 405 and frequency synthesizer 402 in FIG. 4. In the first case, referring to FIG. 5, output signal 502 from VCOoutput pin 4 corresponds to waveform generator output 307 that is coupled to the input of RF switch 302. In the second case, output signal 502 from VCOoutput pin 4 corresponds to waveform output 407 and input signal 501 coupled to VCOin pin 9 operates as multiplexer select signal 410 in FIG. 4.

In one embodiment, the high and low modulation frequencies are selected by R1, R2, and C1 as described in the HCT4046 datasheet. The actual data to be modulated is input into the VCOin pin, and the FSK modulated output is on the VCOout pin. The modulated output is used to control the RF switch. This solution includes modulation frequency synthesis and multiplexing in a single IC implementation. Note that this solution only supports FSK modulation for a single communication channel (BLE Advertising packet channel), because it only generates one low modulation frequency and one high modulation frequency. However, it is easily expanded to support more than one channel by implementing multiple HCT4046 IC's or multiple high-speed VCO-controlled PLLs on a single IC, to cover additional channels. Finally, this single part can support multiple channels provided time is allowed between channels to reconfigure the frequencies in the HCT4046.

FPGA or Custom ASIC Design

In one embodiment, the type of topologies shown above (or other approaches) can be implemented in an FPGA and ultimately transferred to an ASIC design. In one embodiment, all major components are on a single IC, including the digital control, frequency synthesis, frequency selection (multiplexer) and the RF switch. In one embodiment, the ASIC also controls the sensors and has power harvesting and a power management unit as well.

In an alternative embodiment, the ASIC can be similar to the Si4021 Universal ISM Band FSK Transmitter from Silicon Laboratories®. The Si4021 is a single chip, low power, multi-channel FSK transmitter designed for use in the 433, 868, and 915 MHz frequency bands. Such a design requires enhancement to support the 2.4 GHz frequency band for BLE, but the overall IC architecture would be similar.

Overcoming Issues in Multi-Tag Scenarios

In a multi-tag scenario, the most common problem will be collisions. These will occur when two tags want to communicate at the same time. Their RF signals will destructively collide with each other, and the receiver will not be able to recover the message from either tag. Effectively both communicators "jam" each other. This is only exacerbated when there are hundreds, or thousands of tags within the communications range. This is further compounded by competing communications in the same 2.4 GHz band, such as WiFi.

Because the backscatter tags in some embodiments have no receiver, which means that the reader (the phone) cannot communicate with the tags individually and assign communication time slots or retry intervals, the tags have to negotiate these retry intervals on their own. Meanwhile, in one embodiment, power consumption must be minimized on the tags as much as possible, so there isn't the luxury of supporting typical RF-collision-detection circuitry.

The following describes a number of different approaches to overcoming collisions under these conditions, and recovering the initial sensor readings.

Multiple Messages—Percentages

This method might best be considered as "fire and forget". This method sends "enough" duplicates of the message to ensure a high percentage probability that at least one of the messages will be properly received.

Figure 6:
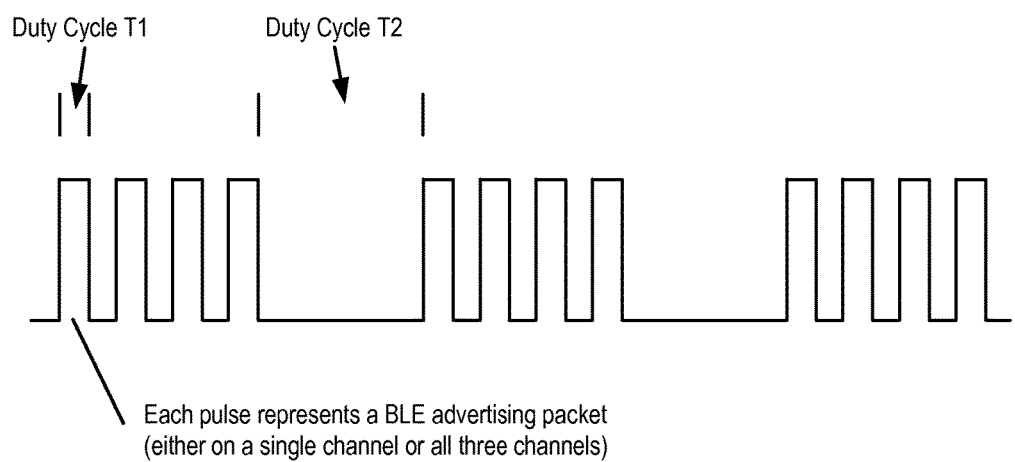
FIG. 6 illustrates an example of sending multiple bursts of multiple messages.

There can be many variations upon this theme, such as sending the message multiple times separated by a duty cycle. Another option is sending multiple bursts of messages. In this case, two duty cycles are involved, the first is the time delay between individual pulses of the burst (T1), and the second is the time delay between bursts (T2). Another variable in this scenario is the number of pulses within a burst to send. FIG. 6 illustrates an example of sending multiple bursts of multiple messages. Referring to FIG. 6, the two different bursts T1 and T2 are shown, and each pulse represent a BLE advertising packet.

One feature of this method is potential redundancy of tags. In one embodiment, the tags are extremely inexpensive (such as the cost of RFID tags), are placed plentifully in the area of concern, so that if some tags are not successful in transmitting their sensed data to a receiver, enough tags are successful, so that the main objective of sensing an area can be accomplished.

Retry Timing Based on RSSI

Inherent clock drift between tags is often used as a way of resolving transmission collisions in an open-loop communications such as BLE sensor tags described here. What this implies is that, given two tags continually transmitting sensed data on exactly the same time scale and duty cycle, their individual timing clocks will eventually slowly drift far enough apart from each other, so that they will no longer conflict. Thus, for a time, they will collide, but at another time, they will both be readable. A variation on this theme is to configure a message retry delay into the sender (RFID uses this method). However, since some embodiments of BLE sensor tags have no receiver, this cannot work.

In one embodiment, the Received Signal Strength Indicator (RSSI) on the tag is used to compute a retry delay. A RF to DC window comparator can generate a DC voltage based on the amount of incident RF energy, with higher voltage indicating greater RF received energy. Retry timing based on this DC voltage level would result in different retry times. Due to varying distances, orientations, and RF multipath effects, the chances of two tags having an identical RSSI measurement from the same CW source are extremely low. Therefore, if retry timing is based on a function of RSSI (stronger RSSI implies longer retry delay), then tags would likely avoid conflicts in most retry scenarios.

Recovery of Individual Tags from a Collision Vector

Another method to receive the sensed data from a plurality of tags which may be colliding with each other is to actually count on the collisions, and perform a reverse matrix computation to obtain the source tags that were read. In RFID systems, it is possible to identify a small number of tags responding to a single read event with all the resulting collisions, provided that the entire solution space is known. For example, from a single RFID read event of items in a shopping cart, even with collisions, the individual ID's can be uniquely recovered given a database of every item in the store. In one embodiment, the same algorithms are used with the tags disclosed herein to overcome collisions. A limitation of this approach, however, is that the tags being read need to be part of a pre-determined solution space. The method then takes the collision vector and reverse-computes the original tags from the solution space.

In the case of sensed data tags, the complete solution space for the tags is not known because the sensed data is not known. In one embodiment, this algorithm is adapted to account for known ID fields which are pre-determined so that the sensed data can be uniquely identified later. In an alternative embodiment, the pre-determined solution set is expanded to include each tag ID with every sensor reading possible. While this at first may seem like a huge number of entries, it actually is not. Consider a temperature sensor. If the location being sensed has a temperature variance of 50-degrees C. (fairly wide temperature bound), to one decimal point of accuracy, each tag would consume 500 entries in the table. Given that the lookup table can support thousands of entries or more, several tags could be pre-loaded in the original solution space with all possible sensor readings included.

Alternate/Multiple Channel Communication

As stated above, typically, the same Bluetooth advertising packet is transmitted on all three advertising channels, to ensure at least one successful transmission has avoided WiFi or other contention in the RF space. However, there is no requirement for this to happen this way. In one embodiment, separate tags advertise only on single channels, opening more RF bandwidth up for other tags to communicate on other channels, thereby reducing the chances for contention with each other by at least one-third.

In another embodiment, the BLE advertising packets may be actually transmitted on channels other than the BLE advertising channels. However, in order to support this direction, the firmware of the BLE receivers needs to be updated to listen for advertising packets "out of channel".

Directional Antennas

Figure 7:
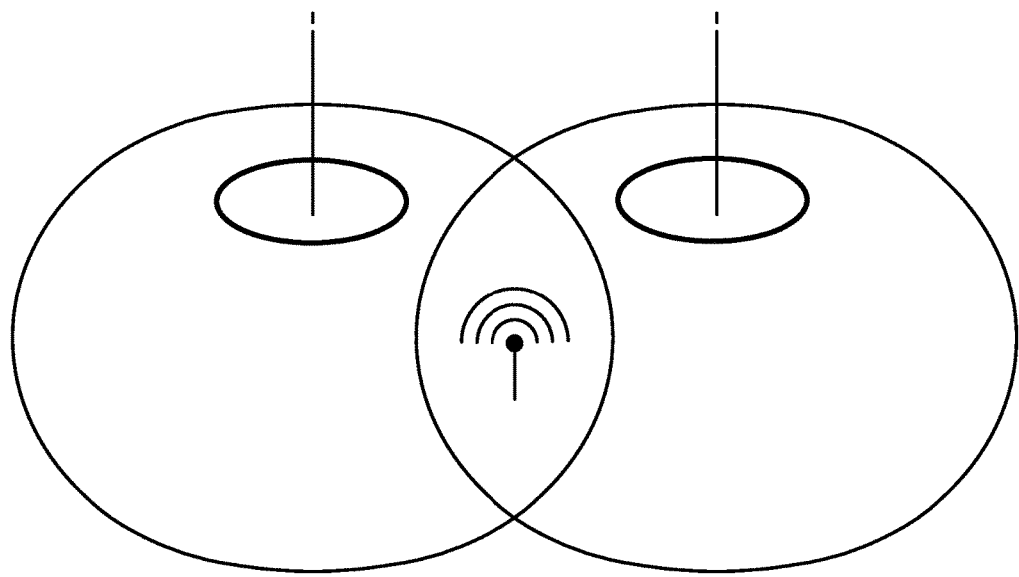
FIG. 7 illustrates an omni-directional antenna collision.

Collisions by two Bluetooth sensor tags are caused by two tags transmitting in the same frequency band at the same time. Most often, radio frequency sensor tags are designed to be omni-directional, that is, they transmit their energy in all directions. Omni-directional antennas create a space in which the transmissions can overlap (collide). This benefits RF energy harvesting of these antennas because they can harvest energy from any direction. But it raises the probability of data collision. An example of trying to receive data from the overlap of two omni-directional antenna beams is shown in FIG. 7. FIG. 7 illustrates an omni-directional antenna collision.

Figure 8:
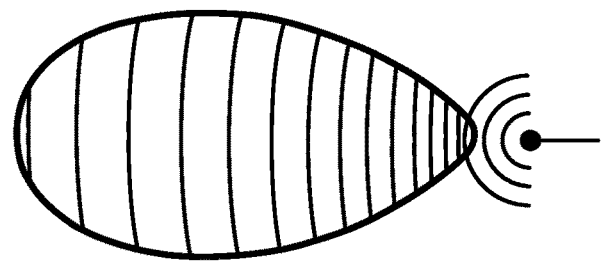
FIG. 8 illustrates directional antennas avoiding collisions.
Figure 8:
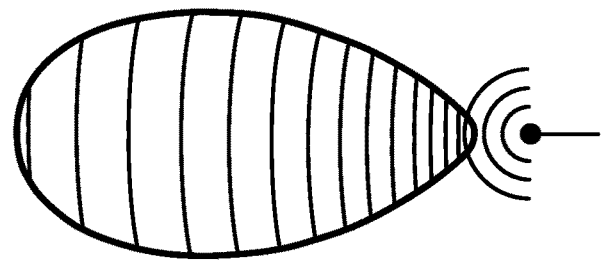

However, if the direction of the energizing source is known, it would be more efficient to create a much higher-gain directional antenna and point the main beam at the energy source, so that much more energy could be harvested, and the communications could also extend to longer ranges. Also, if the antenna beams do not overlap, the sensor tags can actually communicate in the same band at the same time. FIG. 8 illustrates direction antennas avoiding collisions.

Note that this scenario requires two reading devices. This approach is most appropriate if the reader (e.g., BLE cellphone, iPad, etc.) is in a known, fixed location so that the tag antenna beam can be pre-set during system configuration.

Figure 9:
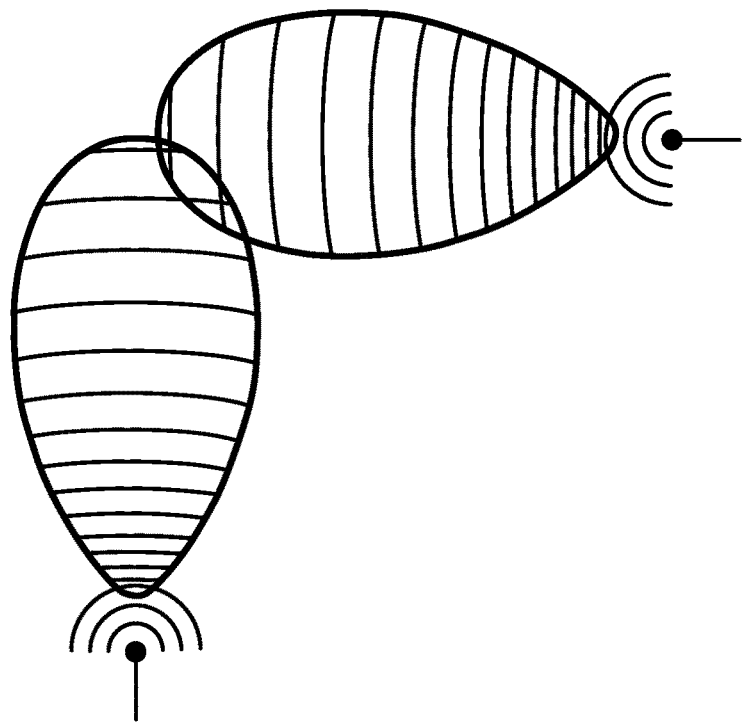
FIG. 9 illustrates directional antennas with a minimum collision space.

Related to this approach, but with a single reading device, leverages different antenna beam angles. FIG. 9 illustrates directional antennas with a minimum collision space.

In this condition, at the intersection of the antenna beams, collisions are likely. But shifting slightly toward either antenna beam dramatically reduces the opportunity for collision, and only requires a single reader device.

Alternatively, the RF sensor performs beam steering for use in energy harvesting and/or for message transmission.

Data Receiving Capability on a Tag

The disclosure above has focused on tag embodiments utilizing backscatter as a transmitter only. In the case of an ID or a sensor tag, this is perfectly suitable, because the typical operational mode for the tag will be transmit only to a host, which receives all the data from all the tags and takes appropriate action. However, there are situations in which these tags need to receive information, such as, for example: configuration, transfer acknowledgement, status inquiries, data log download/upload, failure analysis, and even peer-to-peer communications (network bridge). In one embodiment, the tags includes a standard radio interface for receiving such, and other, communications. One disadvantage of such tag embodiments is that these tags harvest energy from ambient sources, and typical radios are very high power solutions (10 mA or more).

In other embodiments, lower-power solutions are used to implement receive communications on tags. There are a number of possible implementations, the appropriateness of each for ultra-low power receive communications being based on bandwidth, cost, size and other determining factors. Some of the options include, but are not limited to: a wire-based implementation; a USB-based implementation, a BLE-based implementation, an RFID-based implementation, and an infrared (IR)-based or Visible Light Communications (IR/VLC)-based implementation.

An Example of a Wire-Based Configuration

Figure 10:
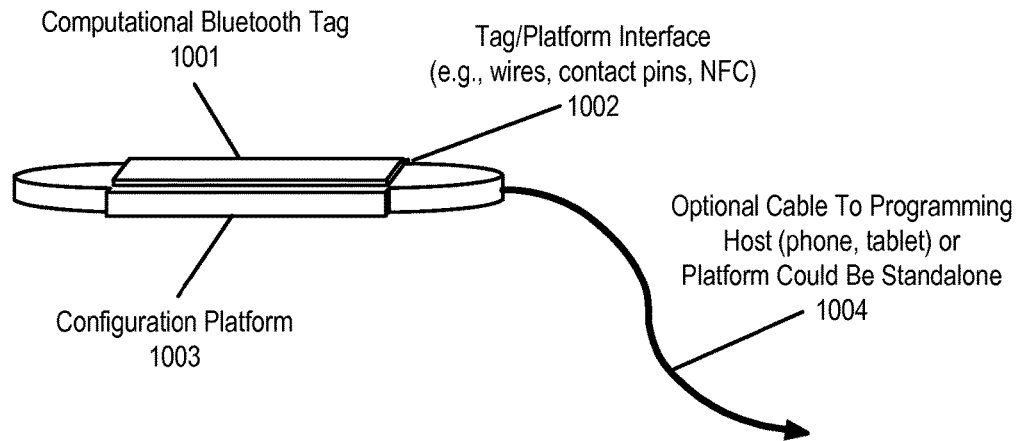
FIG. 10 illustrates one embodiment of a tag that uses wire-based configuration.

In cases where the tag only needs configuration when it is deployed/installed, it would be possible to have a portable programming configuration platform used to configure that tag. FIG. 10 illustrates one embodiment of a tag that uses wire-based configuration. Referring to FIG. 10, a computational Bluetooth tag 1001 is connected to a configuration platform 1003. In one embodiment, configuration platform 1003 has a tag/platform interface 1002 that includes a connector or some other contact-based interconnect system used to connect tag 1001 to platform 1003. In one embodiment, tag/platform interface 1002 comprises a wired interface, such as, for example, I2C, SPI bus, or 1-wire interfaces. In another embodiment, tag/platform interface 1002 comprises a wireless interface, such as, for example, a near field communication (NFC) interface.

In one embodiment, platform 1003 is a standalone device (e.g., a battery powered device, a wall-powered device, etc.). In another embodiment, platform 1003 includes an adapter to another device, such as, for example, a smartphone accessory. In such a case, a cable 1004 to platform 1003 is included.

In one embodiment, platform 1003 comprises a user interface and software to allow a user to determine the configuration for tag 1001. In one embodiment, tag 1001 is inserted into platform 1003, the user programs tag 1001, tag 1001 is removed from platform 1003, and then tag 1001 is installed in the desired location to function normally.

Note that in one embodiment, on tag 1001 itself, the circuitry required to support tag configuration can take power from the host, and need not be powered by energy harvesting performed by tag 1001, and need not be powered on during normal operation. Therefore, this configuration interface places no additional power load upon normal tag operations.

An Example of a USB-Based Configuration

Figure 11:
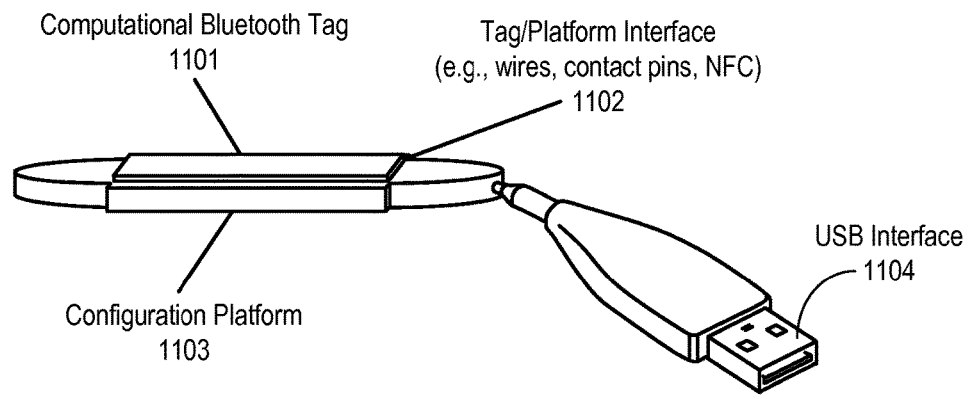
FIG. 11 illustrates one embodiment of a tag that uses USB-based configuration.

This configuration is similar to the wire-based configuration, but compatible with the use of USB instead. FIG. 11 illustrates one embodiment of a tag that uses USB-based configuration. Referring to FIG. 11, a computational Bluetooth tag 1101 is connected to a configuration platform 1103. In one embodiment, configuration platform 1103 has a tag/platform interface 1102 that includes a connector or some other contact-based interconnect system used to connect tag 1101 to platform 1103. In one embodiment, tag/platform interface 1102 comprises a wired interface, such as, for example, I2C, SPI bus, or 1-wire interfaces. In another embodiment, tag/platform interface 1102 comprises a wireless interface, such as, for example, a near field communication (NFC) interface.

In one embodiment, USB interface 1104 provides configuration power to configuration platform 1103 so there is no power burden to normal tag operations (and tag configuration circuits can be completely powered off during normal operations). In one embodiment, tag 1101 has a USB interface built-in, so that it can directly insert into a USB host for configuration, data download/upload, testing, or other operations. In one embodiment, USB interface 1104 directly bridges or connects the host to a microcontroller (e.g., microcontroller 304 of FIG. 3, microcontroller 404 of FIG. 4, etc.).

An Example of a BLE-Based Configuration

In one embodiment, the tag includes a full BLE radio for configuration only. In one embodiment, the BLE radio is used rarely to reduce the overall power requirements. In one embodiment, the BLE radio is normally completely powered off so that it provides no power burden to normal tag operations and energy harvesting, and the BLE radio is turned on by an event. In one embodiment, the event is a wakeup radio. In another embodiment, the event is a mechanical pushbutton. In another embodiment, the event is both a wakeup radio and a pushbutton.

In one embodiment, in the case of the event being a wakeup radio, the wakeup radio is on all the time but is extremely low power (ideally, nanoamp range) putting a very limited power burden on normal tag operations. In one embodiment, the wakeup event is a BLE event, for example, an individual tag ID or a group ID where many tags are awakened at once. In another embodiment, the wakeup event is some other RF event based on the technology of the wakeup detector in the wakeup radio. When the wakeup event is detected, the wakeup radio closes the power switch, which turns on the BLE radio, and full BLE communications can occur. This may require additional energy into the tag, provided by either (a) additional energy into the energy harvesting circuits (for example, brighter light if photovoltaic harvesting is used), or (b) temporarily connecting a battery to the tag.

In one embodiment, in the case of the event being a mechanical pushbutton, a person can squeeze a button or otherwise close an electrical contact to indicate that the BLE radio should be powered on for full BLE communication. In one embodiment, this mechanical contact is an interrupt to a power management unit (which can close the power switch). In another embodiment, the mechanical contact can physically close a circuit connecting a power source to the BLE radio. Once the BLE radio is turned on, full BLE communications can occur.

Figure 12:
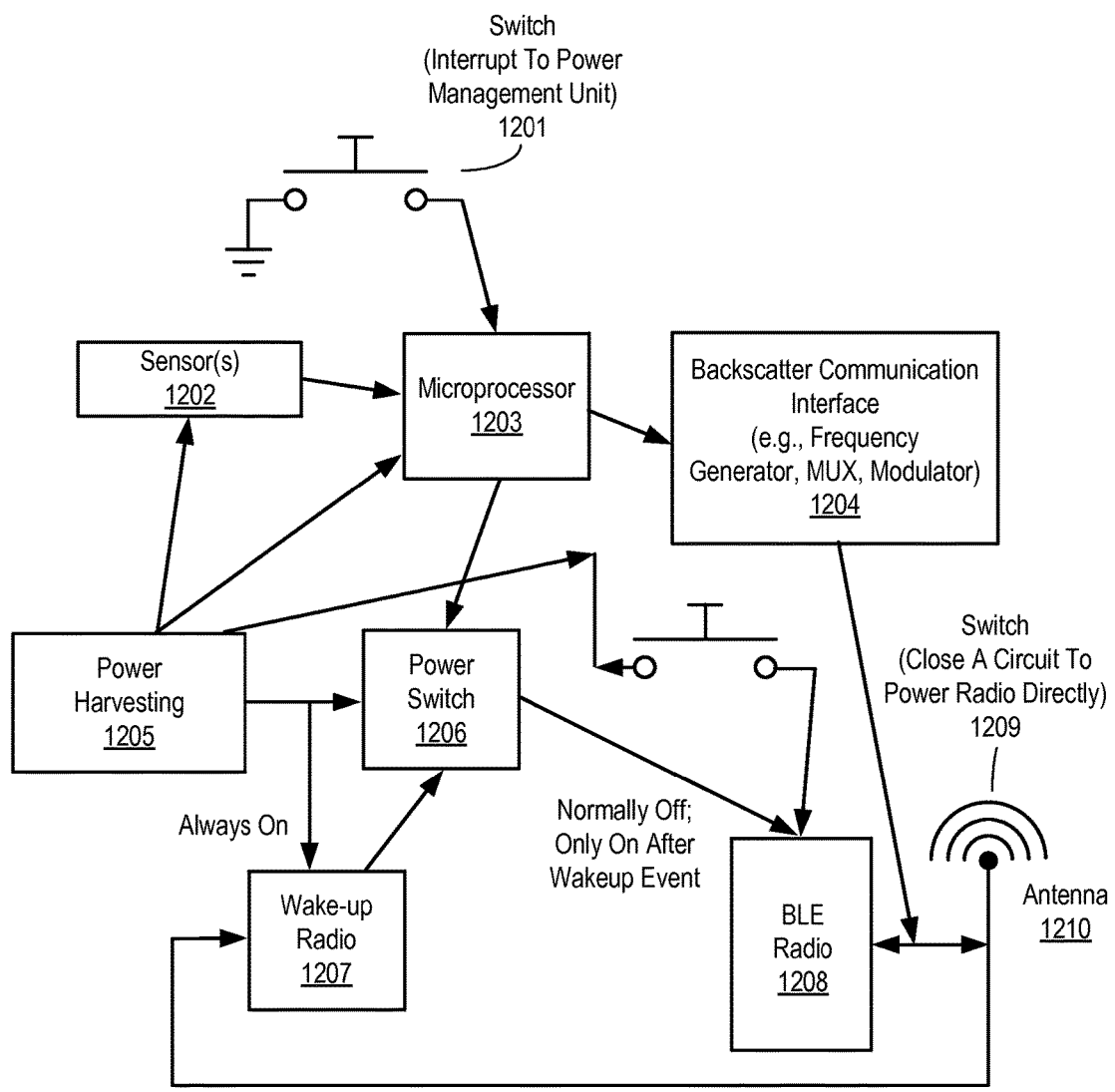
FIG. 12 illustrates one embodiment of a tag with a BLE radio for configuration, illustrating both a wakeup radio and two mechanical pushbutton switches.

FIG. 12 illustrates one embodiment of a tag with a BLE radio illustrating both a wakeup radio and two mechanical pushbutton switches. Note that in one embodiment the tag is implemented with only one or two of these and not all three. Referring to FIG. 12, the tag includes a power harvesting unit 1205 to convert incident RF energy to direct current (DC). The power harvesting unit 1205 includes an energy storage unit to store the recovered DC power. Note that the storage unit may be a separate unit. Power harvesting unit 1205 provides power to the other components of the tag.

The tag also includes sensors 1202, a microprocessor/microcontroller 1203, a backscatter communication interface 1204, and an antenna 1210. In one embodiment, these components perform the same functions as the tag described in FIGS. 3 and 4. For example, backscatter communication interface 1204 includes a frequency generator, multiplexer, and modulator (e.g., an RF switch) such as in FIG. 4.

The tag also includes a BLE radio 1208 coupled to antenna 1210. In one embodiment, BLE radio 1208 is normally off and is on only after a wakeup event. The wakeup event can come from wakeup radio 1207, which is coupled to antenna 1210. In one embodiment, wakeup radio 1207 is powered by power harvesting unit 1205 and is always on. In response to detecting a wakeup event, wakeup radio 1207 closes power switch 1206, which transfers power from power harvesting unit 1205 to BLE radio 1208. This causes BLE radio 1208 to turn on, thereby allowing full BLE communications to occur.

The tag includes mechanical pushbutton switch 1201, which is coupled to provide an interrupt to microprocessor 1203 in response to being pressed. In response to closing the circuit of switch 1201, microprocessor 1203 closes power switch 1206, which causes power to be transferred from power harvesting unit 1205 to BLE radio 1208. This causes BLE radio 1208 to turn on, thereby allowing full BLE communications to occur.

The tag is also shown as including mechanical pushbutton switch 1209, which is coupled to provide power from power harvesting unit 1205 to BLE radio 1208. When switch 1209 is closed, BLE radio 1208 is powered directly by power harvesting unit 1205.

An Example of an RFID-Based Configuration

As discussed above, in one embodiment, receive communications can occur using RFID. In such a case, the RFID system is used to receive information to configure the tag. More specifically, the RFID system would receive information that would be transferred through an interface to a processing unit (e.g., microprocessor/microcontroller) on the tag. The processing unit would then use the information. In one embodiment, the processing unit uses the information to configure the tag.

In one embodiment, the interface for transferring the received information to the processing unit is a RFID-to-serial bus interface (e.g., an I2C bus). There are several RFID-to-serial bus interface IC's available, including chips from NXP Semiconductor and Tego Inc. In this case, in one embodiment, a standard RFID reader "writes" to the tag described here, and an RFID chip on the tag translates that data to the I2C bus, which is connected to the processing unit, so data can be configured into the tag via RFID. This approach provides a very low power medium bandwidth method of configuring the tag.

Figure 13:
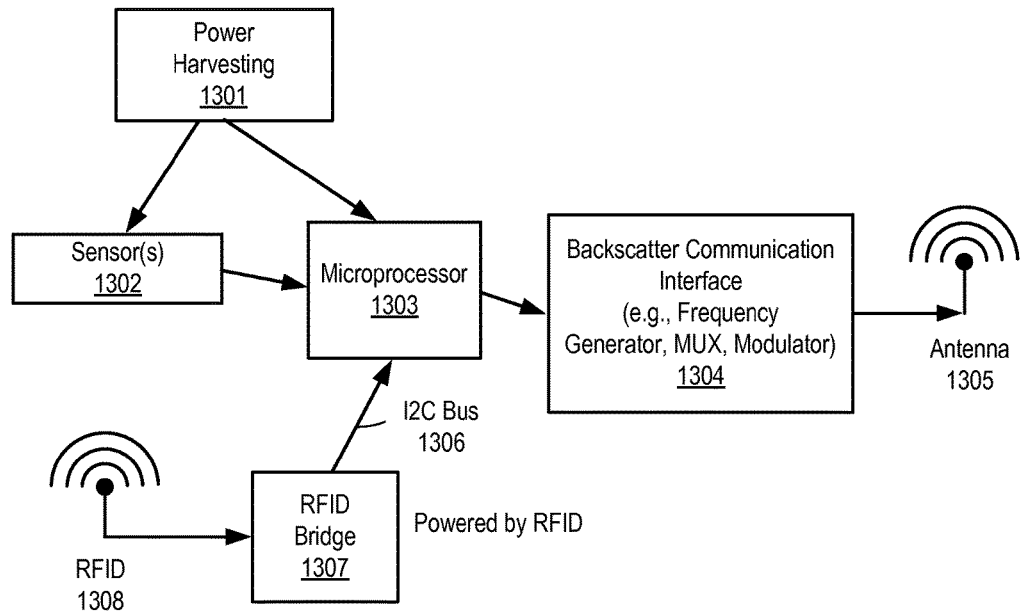
FIG. 13 is a block diagram of one embodiment of a tag that uses RFID-based configuration.

FIG. 13 is a block diagram of one embodiment of a tag that performs RFID-based configuration. Referring to FIG. 13, the tag includes a power harvesting unit 1301 to convert incident RF energy to direct current (DC). Power harvesting unit 1301 includes an energy storage unit to store the recovered DC power. Note that the storage unit may be a separate unit. Power harvesting unit 1301 provides power to the other components of the tag.

The tag also includes sensors 1302, a microprocessor/microcontroller 1303, a backscatter communication interface 1304, and an antenna 1305. In one embodiment, these components perform the same functions as the tag described in FIGS. 3 and 4. For example, backscatter communication interface 1304 includes a frequency generator, multiplexer, and modulator (e.g., an RF switch) such as in FIG. 4.

An RFID 1308 on the tag is coupled to an RFID bridge 1307, which is coupled to microprocessor 1303 via an I2C bus 1306. When an RFID reader powers RFID 1308, the information from RFID 1308 is translated by RFID bridge 1307, and the translated data is transferred to microprocessor 1303 via I2C bus 1306, thereby allowing the data to be configured into the tag via RFID. Power for RFID bridge 1307 can be harvested by RFID antenna 1308, or be supplied by power harvesting unit 1301, depending on the needs of the application and the amount of RF power available.

An Example of an Infrared (IR) or Visible Light Communications (VLC)—Based Configuration In one embodiment, light-based communication methods are used to send data (e.g., configuration, transfer acknowledgement, status inquiries, etc.) into the tag. In such cases, a light-based receiver on the tag is used to receive information. In one embodiment, the light-based receiver is an IR receiver. In another embodiment, the light-based receiver is a VLC receiver. Note that the receiver may be implemented with a transceiver.

In one embodiment, the light-based receiver on the tag is normally completely powered off to reduce or minimize the power burden placed on the tag power budget and is turned on when data is being sent to the tag. In one embodiment, to turn on the light-based receiver, a mechanical switch is used. In another embodiment, to turn on the light-based receiver, a detector wake-up circuit is used. In another embodiment, the light-based receiver is turned on via a mechanical switch that requires no power (except in the rare cases where this is required), but is less convenient than using a wake-up detector which will need to remain powered on all the time during normal operation. When the receiver is awakened (via, e.g., a switch or a wakeup detector), an external light-based transmitter (e.g., an IR transmitter, a visible light transmitter, etc.) transmits the necessary data into the light-based receiver on the tag. In one embodiment, the light-based transmitter is custom designed like a typical TV remote control, or it could even be a smartphone, where the flashlight feature is used to transmit data to the receiver.

Figure 14:
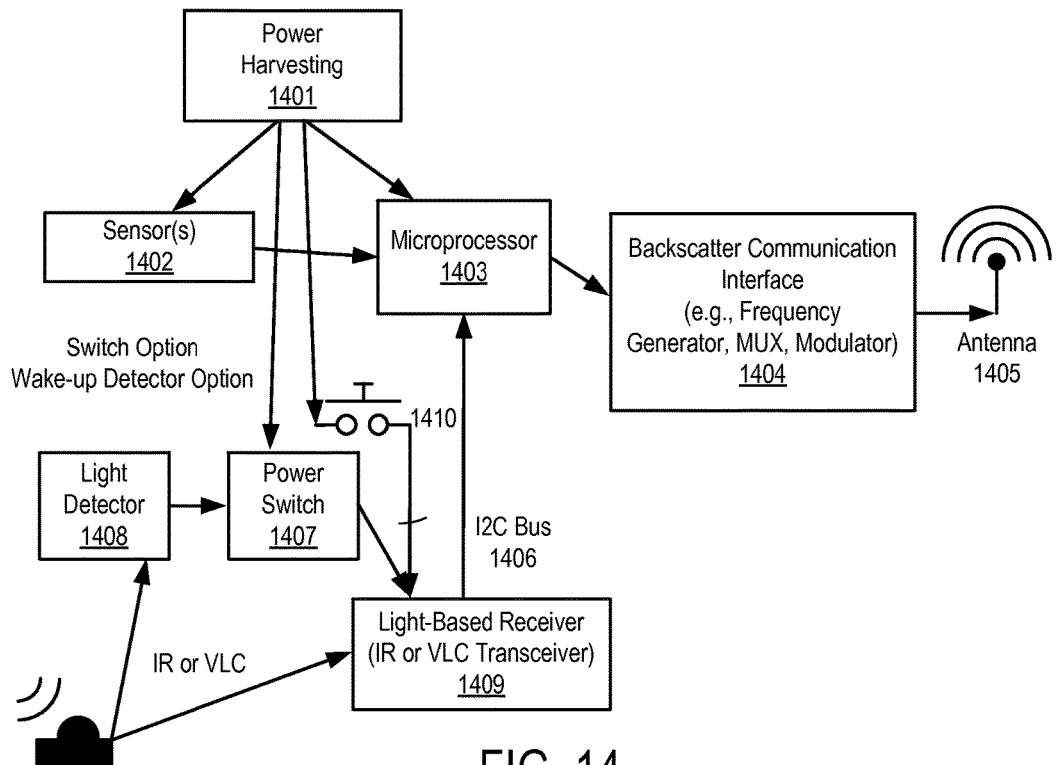
FIG. 14 is a block diagram of one embodiment of a tag having a light-based receiver for configuration.

FIG. 14 is a block diagram of one embodiment of a tag having a light-based receiver. Referring to FIG. 14, the tag includes a power harvesting unit 1401 to convert incident RF energy to direct current (DC). Power harvesting unit 1401 includes an energy storage unit to store the recovered DC power. Note that the storage unit may be a separate unit. Power harvesting unit 1401 provides power to the other components of the tag.

The tag also includes sensors 1402, a microprocessor/microcontroller 1403, a backscatter communication interface 1404, and an antenna 1405. In one embodiment, these components perform the same functions as the tag described in FIGS. 3 and 4. For example, backscatter communication interface 1404 includes a frequency generator, multiplexer, and modulator (e.g., an RF switch) such as in FIG. 4.

The tag also includes light-based receiver 1409 (e.g., an IR transceiver, a VLC transceiver) coupled to microprocessor 1403. In one embodiment, light-based receiver 1409 is normally off and is on only after a wakeup event or pressing of a mechanical push button switch 1410. The wakeup event can come from light detector 1408, which is coupled to power switch 1407. In response to detecting light from an external light-based transmitter (e.g., an IR transmitter, a visible light transmitter, etc.), light detector 1408 closes power switch 1407, which transfers power from power harvesting unit 1401 to light-based receiver 1409. This causes the light-based receiver 1409 to turn on, thereby allowing receive communications to occur. Light-based receiver 1409 receives data for configuring the tag and transfers the data, via I2C bus 1406, to microprocessor 1403.

The tag also includes mechanical pushbutton switch 1410, which is coupled to provide power from power harvesting unit 1401 to light-based receiver 1409. When switch 1410 is closed, light-based receiver 1409 is powered directly by power harvesting unit 1401.

Alternative, Purely Mechanical Options

Some tags only require configuration for simple conditions, such as, for example, specifying a retry time delay, specifying which sensors to use, or specifying which direction is required to beam-steer the antenna for best communications or RF energy harvesting. After performing the configuration, these tags can be installed to perform many functional years of maintenance-free operational life. Sometimes the simplest interfaces are the most appropriate for lowest cost and zero-power operations. In one embodiment, a tag has one or more mechanical dial switches or configuration slide switches to encode the configuration requirements for the tag. In another embodiment, the tag includes calibration marks that are pre-indicated on the tag itself to cause a tag antenna to be mechanically pre-aimed by the installer for optimal operation based on the needs of the specific site at installation time. In this way, purely mechanical configuration options are also a way for the tag to "receive" configuration information.

RF Energy Harvester

Figure 17:
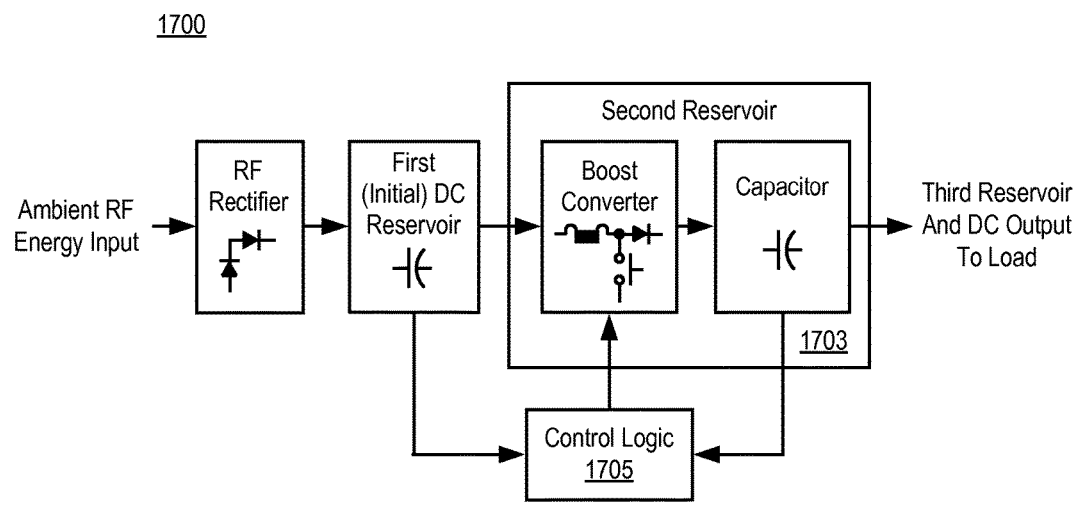
FIG. 17 is a block diagram of one embodiment of an RF energy harvester.

FIG. 17 is a block diagram of one embodiment of an RF energy harvester. Referring to FIG. 17, RF energy harvester 1700 comprises RF rectifier 1701, a first direct current (DC) reservoir (storage) 1702, a boost converter and second reservoir 1703, a third reservoir 1704, and control logic 1705.

RF rectifier 1701 receives ambient RF energy input received from an antenna and rectifies the RF energy to produce a DC voltage.

First DC reservoir 1702 stores the voltage generated from the rectified RF signals received by device 100. In one embodiment, reservoir 1702 comprises a capacitor. In one embodiment, the size (value) of the capacitor that is selected for use is based on the stored energy above a voltage threshold for the ambient RF input power.

Figure 22A:
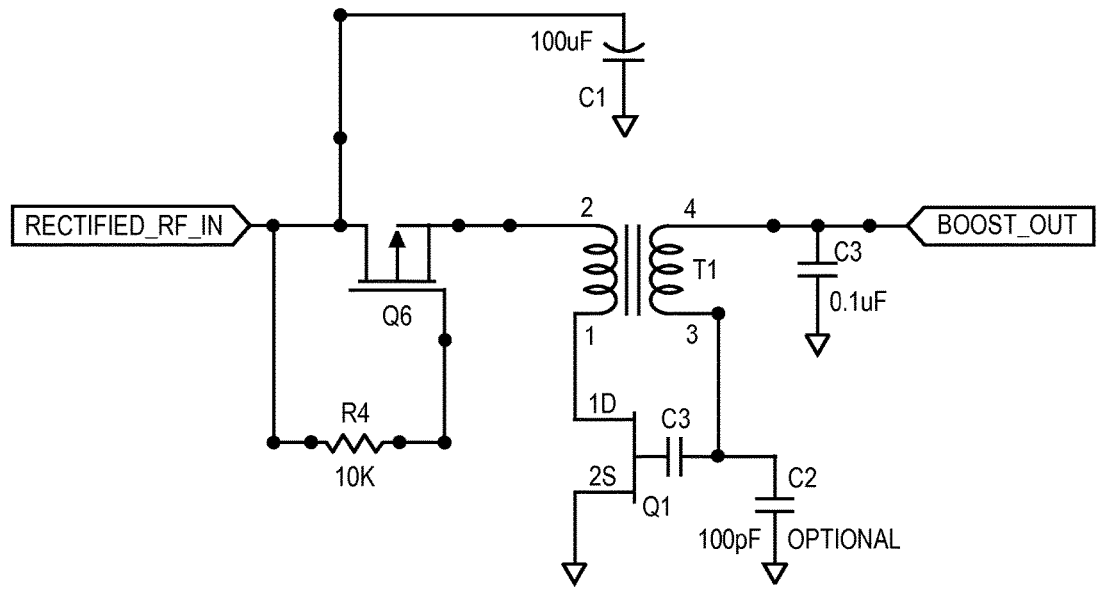
FIG. 22A is a circuit schematic of one embodiment of a DC-DC boost converter.
Figure 23A:
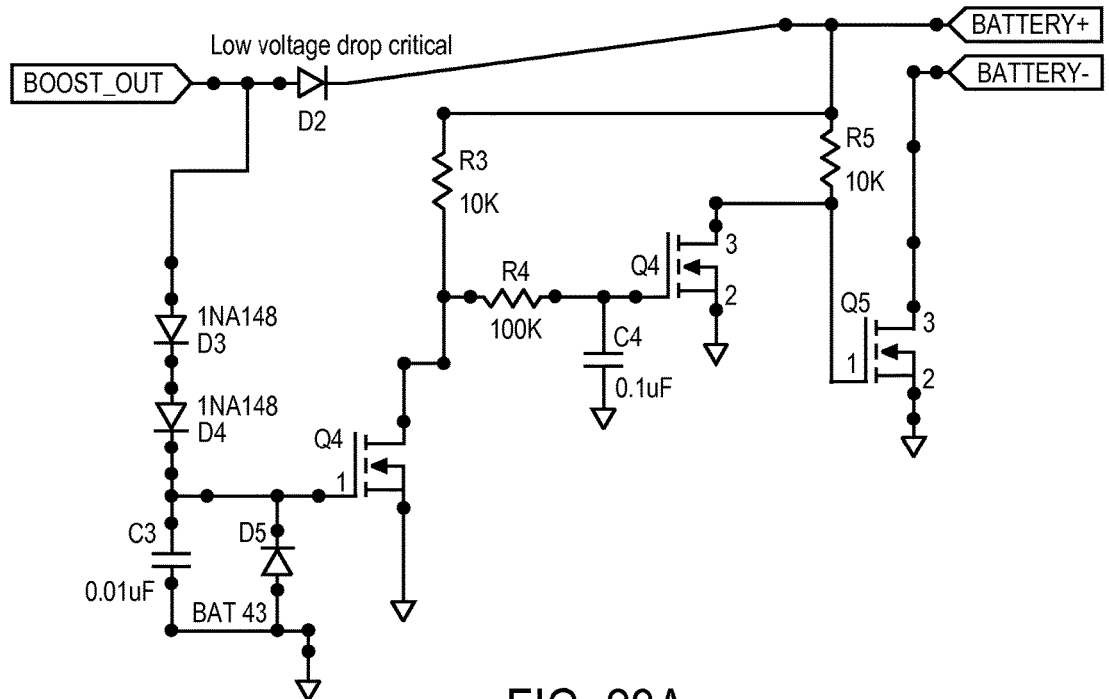
FIG. 23A is a circuit schematic of one embodiment of a battery charger.
Figure 22B:
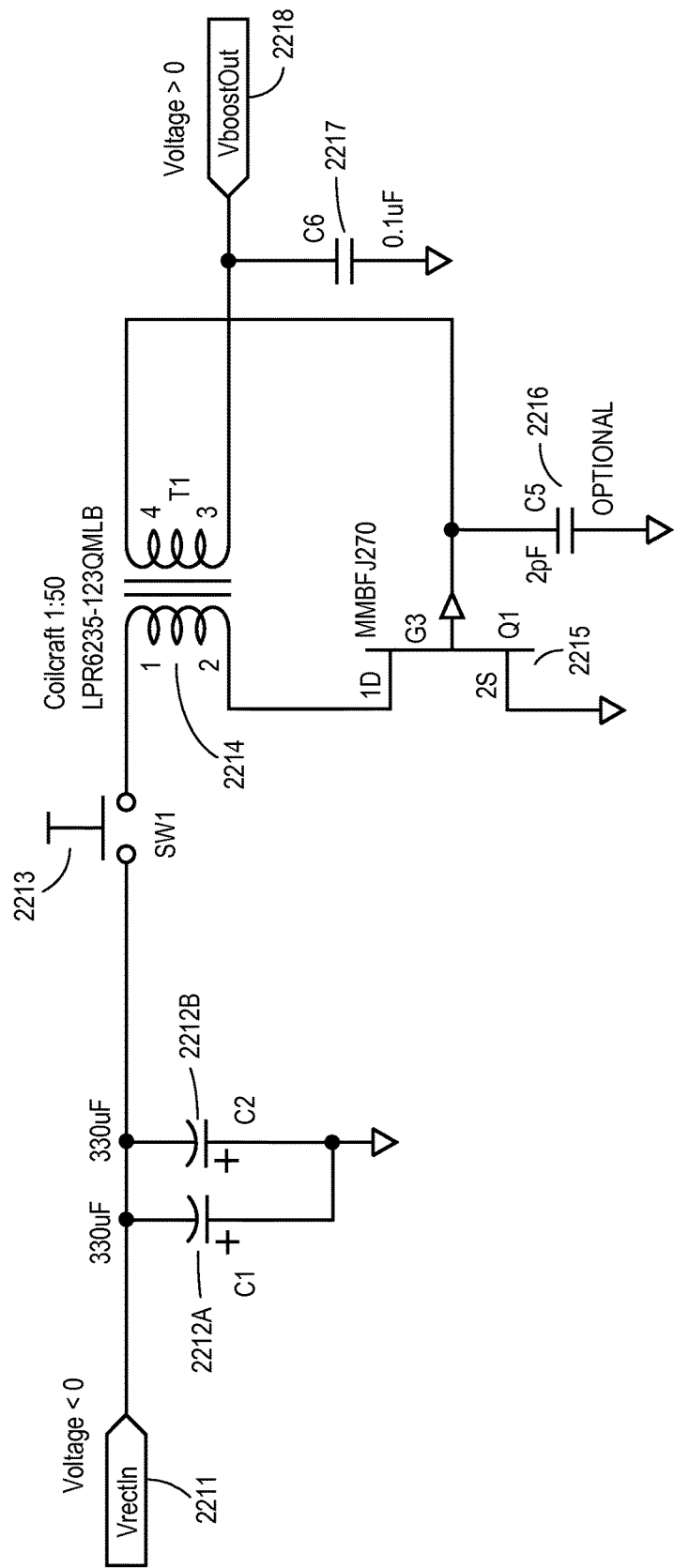
FIG. 22B is a circuit schematic of an alternative embodiment of a DC-DC boost converter.
Figure 23B:
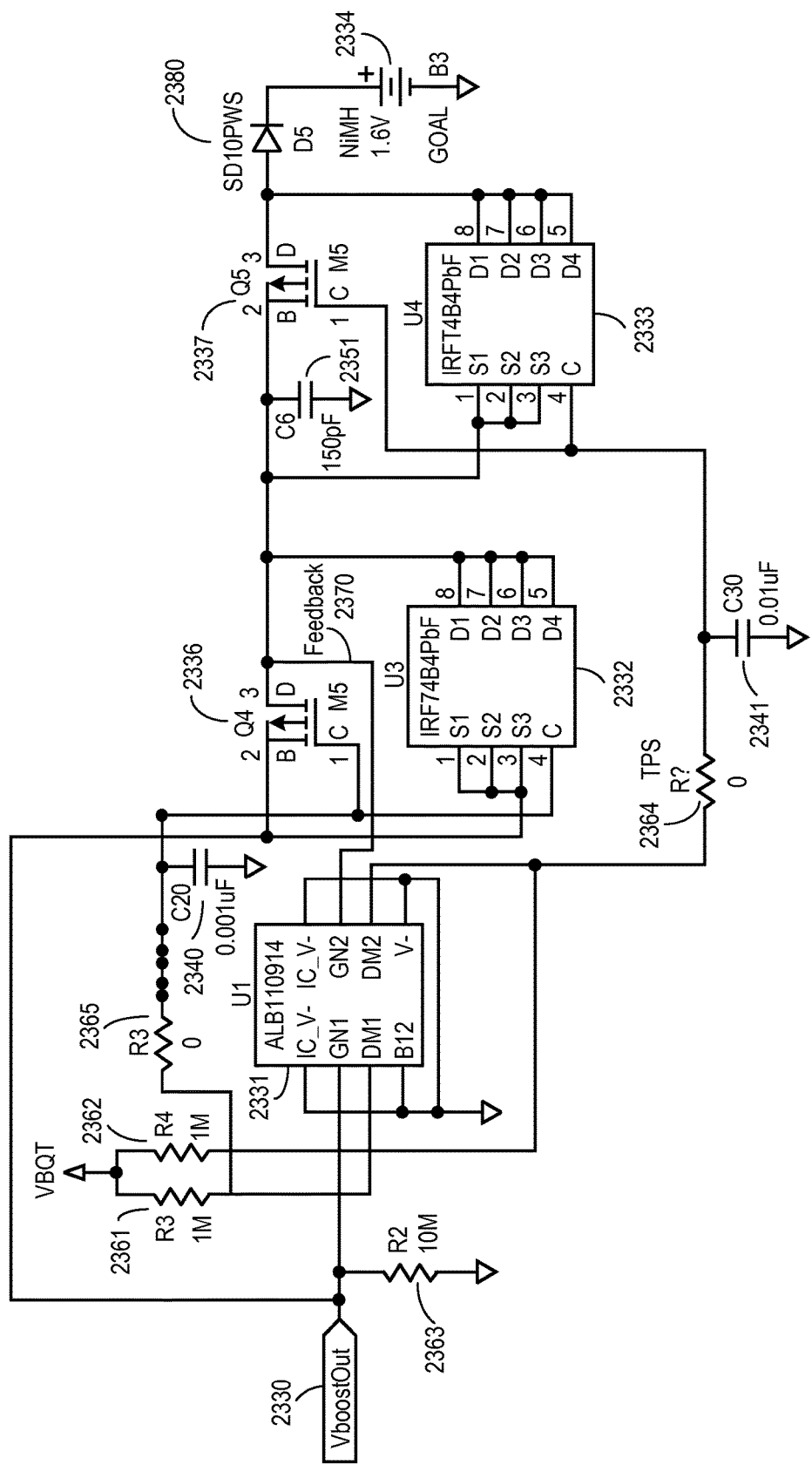
FIG. 23B is a circuit schematic of an alternative embodiment of a battery charger for a similar type of battery system as FIG. 22B.

Second DC reservoir 1703 receives the voltage and increases the voltage. To increase the voltage, second DC reservoir 1703 includes a DC/DC converter. In one embodiment, the DC/DC converter comprises a boost converter which includes a self-excited oscillator for operation. The self-excited oscillator includes a junction field effect transistor (JFET) coupled with a transformer. In one embodiment, the amount of the boost conversion is a function of the input energy, and the DC/DC converter is designed to maximize the output voltage as a function of input voltage in this low-energy environment. FIGS. 22A and 22B illustrate embodiments of a booster converter circuit. FIGS. 23A and 23B illustrate embodiments of a charger schematic that receives the output of the boost converter, such as, for example, the one shown in FIG. 22A or 22B.

The upconverted voltage from the DC/DC converter is stored in a storage device of second reservoir 1703. In one embodiment, second reservoir 1703 uses a capacitor to store the upconverted voltage. In another embodiment, second reservoir 1703 uses an inductor to store the upconverted voltage, but this is a much shorter-term storage option.

When the energy stored in second reservoir 1703 reaches a certain level, the energy is transferred to a third reservoir (not shown). Thus, the transfer occurs periodically at a rate determined by the amount of input energy. In one embodiment, the third reservoir comprises a battery, a capacitor, a supercap, etc. The third reservoir provides DC energy to a load.

In one embodiment, the load comprises a sensor, processor or microcontroller, and/or a communication unit. In one embodiment, the DC voltage from the third reservoir is able to run the load, while the voltage produced by rectifier 1701 would not be able to do so.

Control logic 1705 controls the energy harvesting process. In one embodiment, control logic 1705 comprises a separate unit that generates control signals to control each of the reservoirs 1702-1703. In another embodiment, the control is distributed through various discrete gating components such that a separate control unit is not necessary but the function is still performed.

Figure 18:
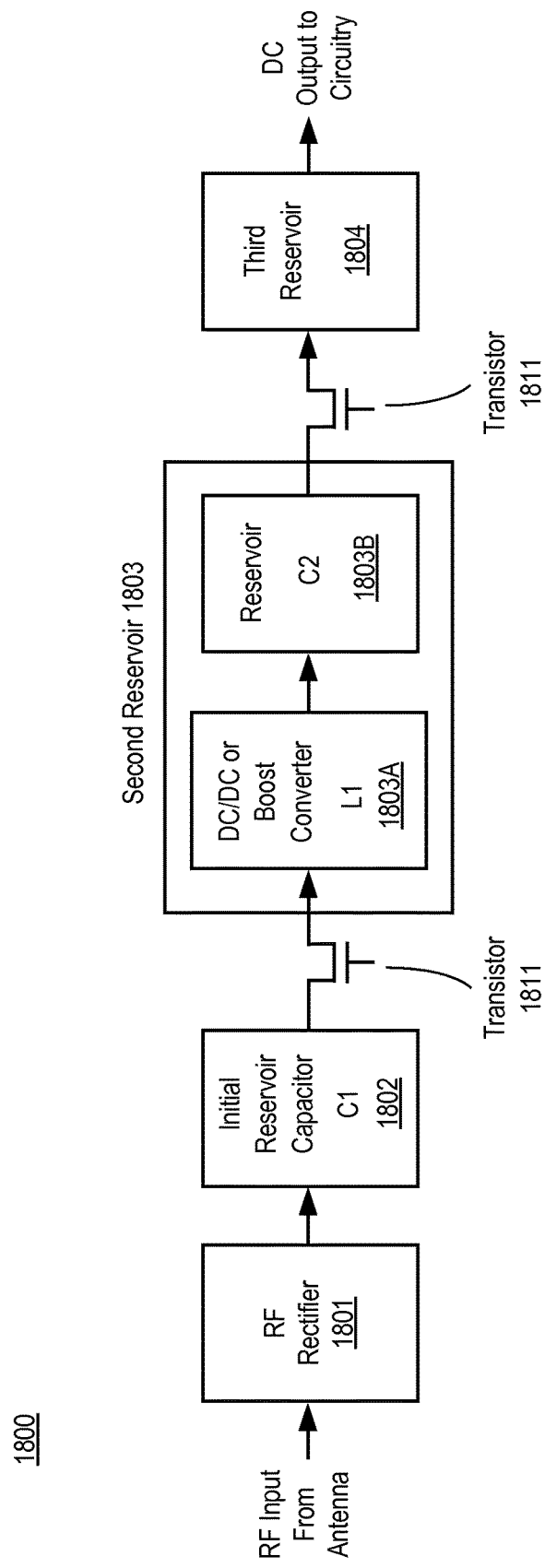
FIG. 18 is another more detailed block diagram of one embodiment of an RF energy harvester.

FIG. 18 is another more detailed block diagram of one embodiment of an RF energy harvester. Referring to FIG. 18, RF energy harvester 1800 comprises RF rectifier 1801, a first direct current (DC) reservoir (storage) 1802, second reservoir 1803, and a third reservoir 1804. In one embodiment, the input to RF rectifier 1801 is an RF input from an antenna on the sensor device. RF rectifier 1801 converts the RF input signals to a voltage. In one embodiment, the voltage may range between 10 mV and 500 mV. The voltage is stored in reservoir 1802. In one embodiment, reservoir 1802 comprises a ceramic capacitor 1 uF to 100 uF or more.

In one embodiment, the stored energy from reservoir 1802 is transferred to second reservoir 1803 via a transistor 1811, self-gated as the voltage rises in reservoir 1802. In one embodiment, second reservoir 1803 comprises a boost converter 1803A. The boost converter 1803A operates to upconvert the voltage stored in reservoir 1802 and store that upconverted voltage into reservoir 1803B.

The energy stored in second reservoir 1803 is transferred to third reservoir 1804. In one embodiment, third reservoir 1804 comprises a tantalum capacitor, supercap 100 uF to 1 F or a battery. In one embodiment, transistor 1812 (e.g., a FET) couples second reservoir 1803 to third reservoir 1804, which turns on when second reservoir 1803 reaches an optimal voltage. In one embodiment, transistor 1812 is controlled at least in part by the envelope of the received RF energy such that when the voltage stored in reservoir 1803B reaches a certain watermark level, transistor 1812 closes/turns on and the energy is transferred. In one embodiment, through the selection of high gate-threshold transistors, the voltage can build up fairly high in reservoir 1803 (as much as 1-2V) before the transistor 1812 closes/turns on. Transistor 1812 closes/turns on automatically when the gate threshold of the transistor design is reached in reservoir 1803. As soon as transistor 1812 closes/turns on, the energy is transferred from reservoir 1803 into reservoir 1804, thus depleting the energy in reservoir 1803, and the gate threshold falls below the watermark level and the transistor 1812 closes/opens again. The process then repeats when the voltage in reservoir 1803 becomes sufficiently high.

Note that transistor 1811 and 1812 may be replaced with other types of switches.

Waveform Aware Harvesting

In one embodiment, the RF waveform harvester comprises a RF to DC converter that is optimized for use with non-continuous wave (CW) signals. In another embodiment, the RF waveform harvesters are waveform aware and are able to perform ambient energy harvesting based on a waveform model, where the available RF energy is in the form of communication waveforms of a variety of types. Examples of commonly-harvested ambient RF energy sources with non-continuous wave signals include, but are not limited to, digital television (DTV) broadcasts, cellular base station transmissions (e.g., GSM, Code Division Multiple Access (CDMA)), Wi-Fi transmissions, etc.

For example, in one embodiment, WiFi is the communications waveform that is the ambient form of energy to be harvested. WiFi is bursty and has low amplitude compared to other sources of energy, where a bursty signal has a high peak to average ratio over ms to s time scale. For example, some WiFi signals have WiFi transmission burst times on the order of 1 ms. For a bursty signal, the harvester can only contribute energy to the reservoir capacitor ($C_x$) when the ambient source is transmitting.

Figure 19:
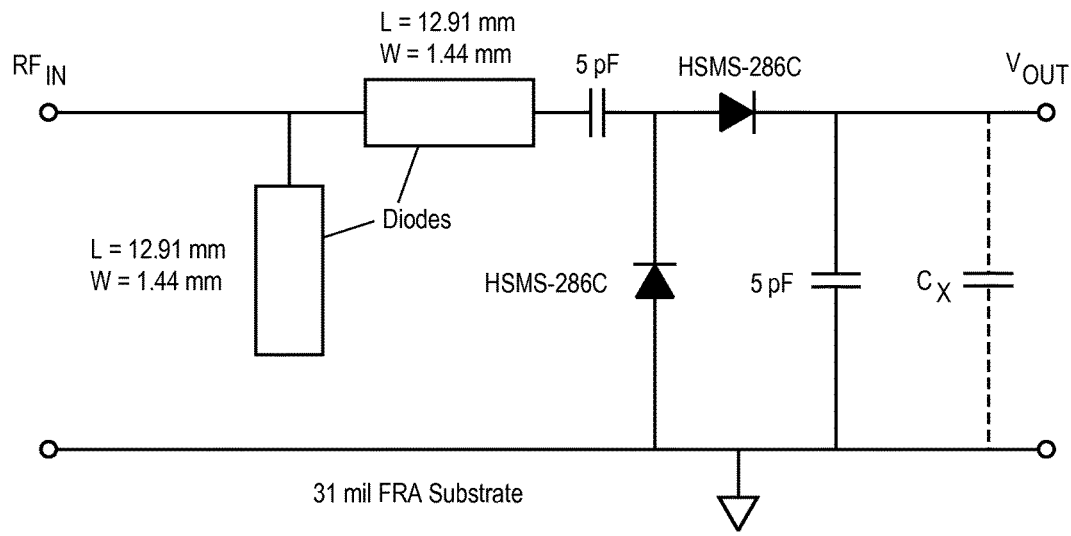
FIG. 19 illustrates a diode-based harvester schematic.

FIG. 19 illustrates a diode-based harvester schematic. Referring to FIG. 19, in one embodiment, the harvester is designed to be well matched at input power levels below −20 dBm where the majority of ambient Wi-Fi signals are expected to fall. Thus, harvester is characterized both in terms of its input match from 2.4 GHz to 2.5 GHz, as well as for harvesting efficiency at its maximum power point (MPP). Harvesting efficiency is defined as the ratio of input RF power at the harvester to harvested DC power at the load ($\eta$=PDC/PRF).

The purpose of capacitor $C_x$ in FIG. 19 is to store charge for any subsequent active electronic circuitry. In one embodiment, typical circuit power-up threshold voltages $V_{TH}$ equals 0.8 V, as is typical for CMOS logic in commodity processes. In another embodiment, the power-up threshold voltages $V_{TH}$ equals 50 mV, as is typical for ultra-low startup voltage boost converters using JFETs. Alternatively, specially doped CMOS transistors, floating gate devices, or Silicon on Insulator (SOI) transistors may be capable of operation down to voltages approaching $V_{TH}$=50-100 mV as well.

If the usable energy is defined as the portion of the stored energy above some threshold voltage $V_{TH}$, the following describes how to find a value of $C_x$ given the ambient RF input power and the signal's duty cycle. This is based on the maximum power point curve for the harvester, the typical burst timings for the ambient signal of interest (e.g., WiFi with some traffic model), and a time domain response for the harvester as a function of $C_x$. Thus, in one embodiment, the storage capacitor selection $C_x$ is optimized on the time scale of network traffic for the signal being harvested.

Figure 20:
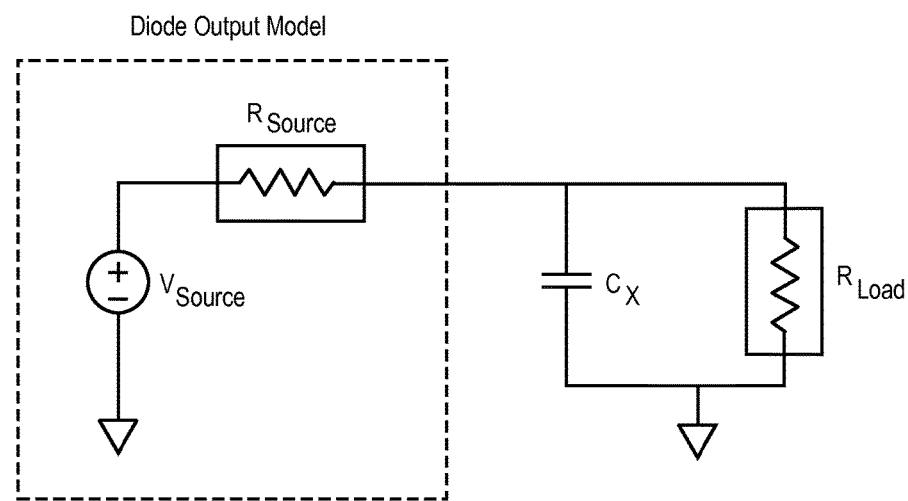
FIG. 20 illustrates a diode output circuit model.

FIG. 20 illustrates a diode output circuit model. Because the diode is a nonlinear device, the power delivered to the load varies dramatically with load impedance. The Maximum Power Point Tracking (MPPT) circuit functions as a load impedance converter to maximize the power delivered to the load, given a particular nonlinear operating point.

Referring to FIG. 20, the diode output model consists of an open-circuit voltage $V_{source}$ along with a nonlinear source resistance $R_{source}$. The pair, $V_{source}$, $R_{source}$, represents a fixed operating point at maximum power-point (MPP). The load resistance $R_{load}$ includes any leakage currents in $C_x$ as well as the quiescent current of the active circuitry attached to the harvester. In other words, the load impedance $R_{load}$ is chosen a priori based on the MPP of the harvester at a given ambient signal level (the maximum power point of the harvester given the input power). Using this model, only the effect of varying $C_x$ (not other system conditions) is considered.

Figure 21A:
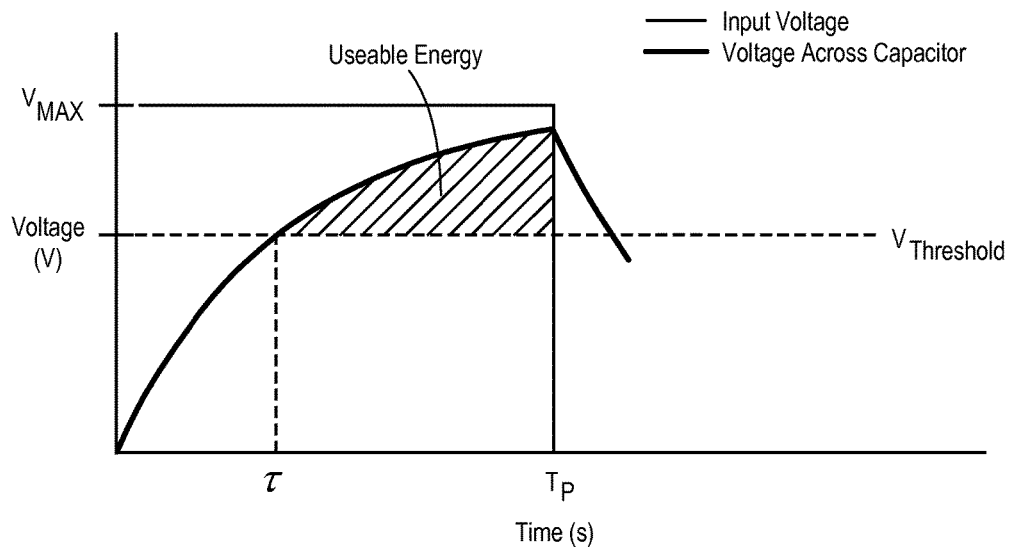
FIG. 21A illustrates the usable energy stored in capacitor $C_X$ during one transmission burse of duration $T_p$.

FIG. 21A illustrates the usable energy stored in capacitor $C_x$ during one transmission burse of duration $T_p$. Referring to FIG. 21A, the usable energy in $C_x$ is represented as the shaded portion of the curve above the voltage threshold and below the voltage across the capacitor.

Figure 21B:
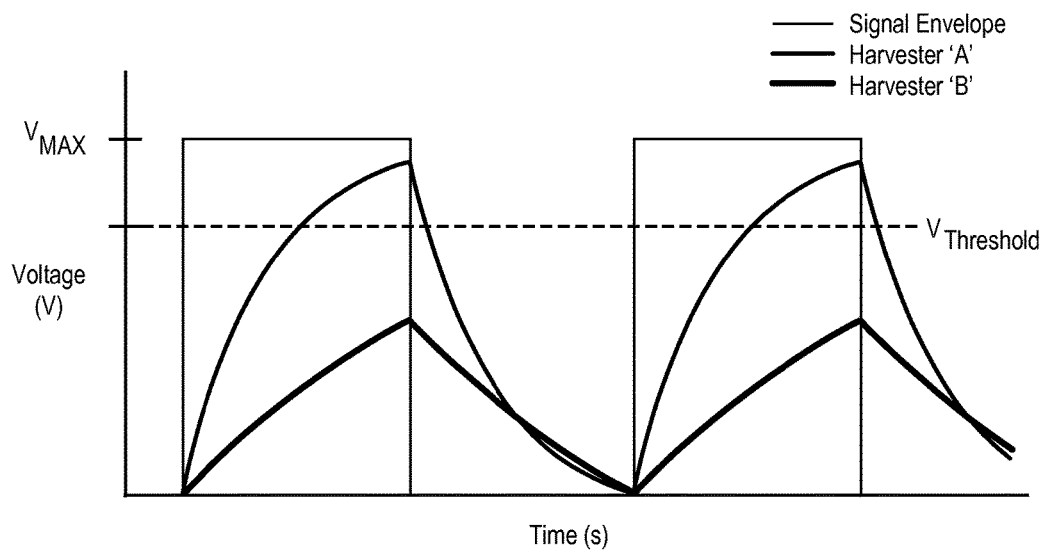
FIG. 21B illustrates examples of good and bad choices of $C_X$.

FIG. 21B illustrates examples of good and bad choices of $C_x$. If $C_x$ is too large, the active circuitry will never be powered because the input energy is insufficient to generate voltage above the threshold. On the other hand, if $C_x$ is minimized, little energy will be stored in the reservoir $C_x$ and the runtime of the active circuitry will not extend beyond the transmission intervals of the RF source. Referring to FIG. 21, harvesters 'A' and 'B' represent different choices for $C_x$ with the same conditions otherwise. In harvester A, $C_x$ looks appropriate as the output voltage exceeds $V_{TH}$ during each burst, while in harvester B, $C_x$ is too big and the output voltage never exceeds $V_{TH}$ so there is no usable energy.

An expression is derived for the useful-energy-maximizing reservoir capacitance $C_X$ as a function of ambient RF signal duty cycle and the load impedance RL at a diode harvester's maximum power point. The expression may be used to calculate the usable energy as a function of the known parameters and the unknown capacitance $C_X$.

The total energy in $C_x$ may be expressed as follows:

$$E = \frac{1}{2}CV^2$$

where C is the capacitance and V is the terminal voltage of $C_X$. It is assumed that the energy stored on the capacitor is only usable when the capacitor voltage is above the desired threshold $V_{TH}$. The usable energy is thus the difference between the stored energy at the end of an RF transmission (at time $t=T_p$) and the stored energy when $C_X$ is charged only to $V_{TH}$ and is expressed as follows:

$$E_{usable} = \frac{1}{2}C[V_{T_p}^2 - V_{th}^2]$$

where $V_{T_p}$ is the terminal voltage on $C_X$ at the end of an RF transmission (e.g., at the end of each burst) of duration $T_p$ and is expressed as:

$$V_{T_p} = V_{src}(1 - e^{-T_p/R_LC})$$

By substitution, the equation for the usable energy may be re-written in terms of C and the known values of $R_L$, $V_{TH}$ and $T_p$ as follows:

$$E_{usable} = \frac{1}{2}CV_{T_p}^2\left[e^{-\frac{2T_p}{R_LC}} - 2e^{-\frac{T_p}{R_LC}} + \left(1 - \left(\frac{V_{th}}{V_{T_p}}\right)^2\right)\right]$$

The equation may be solved for $E_{usable}$ as a function of $C_X$.

Thus, a new class of RF energy harvesters, referred to herein as waveform aware harvesters, have been described. These RF energy harvesters are RF to DC converters that are optimized for their performance with non-CW signals.

A Rectenna Embodiment

In one embodiment, the antenna the RF rectifier of the RF energy harvester are combined together to form a rectenna. In one embodiment, the antenna is a dual-linear polarized wideband probe fed air dielectric circular patch antenna that is composed of two layers of double-sided printed circuit substrate. The front PCB carries the circular patch itself, implemented on the top and bottom layers of the front PCB. The back PCB serves as the ground plane for the patch antenna and also carries dual RF rectifiers, one for each polarization. The back PCB also carries the DC power management circuitry. In one embodiment, the circular patch itself is 59 mm diameter on a 100 mm2 board. The boards are separated by 5 mm aluminum spacers, which serve as probe feeds to the air dielectric patch. An advantage of this antenna design is that both horizontal and vertical polarized energy is captured by a single antenna and made available to two rectifiers without the power combining loss typical of a single feedpoint, circularly polarized antenna. Another advantage of the probe-fed design is that the center of the patch is at DC ground to reduce, and potentially minimize, ESD damage to the fragile RF diodes. In one embodiment, the antenna is fabricated on 0.031" thick, double sided Rogers 4003 substrate material. In one embodiment, the rectenna includes rectifying diodes. In one embodiment, the rectifying diodes are HSMS-286C RF detector diodes from Avago and are used in the single stage voltage doubler configuration, with separate rectifiers on each of the two feedpoints of the antenna. In one embodiment, a microstrip matching networks are used instead of lumped L- and C-elements to increase, and potentially maximize, element Q.

DC-DC Boost Converter Embodiments

FIG. 22A is a circuit schematic of one embodiment of a DC-DC boost converter. In one embodiment, the boost converter receives a negative voltage as an input, and switches the current through the transformer via a p-channel JFET in order to produce a positively-biased boosted voltage output.

The boost converter includes an input capacitor which is the same as the capacitor of the first DC reservoir (e.g., reservoir 1702 of FIG. 17, initial reservoir capacitor 1802 of FIG. 18). In another embodiment, there is an output capacitor after the boost converter. This capacitor can be the same as the capacitor that is used as the charger input capacitor. The relative values of the capacitors are selected so that conservation of energy holds because an output capacitor that is too small will lose energy, but one that is too large will result in limited boosted voltage output. A 1000:1 ratio of capacitances is a good "rule of thumb" to apply, though other ratios may be used.

In one embodiment, in order to start the boost converter, it is necessary to allow at least 40-50 mV to build up across the input capacitor before adding the boost converter load (e.g., before allowing the boost converter to output its boosted voltage output). A pushbutton switch is an easy way of meeting this need according to one embodiment. In alternative embodiments, a dedicated circuit element is used in place of the push button. For example, an ultra-low power comparator (e.g., operational amplifier), an ultra low-power relay, or a momentary switch (e.g., a rocker switch) can be used to hold off the boost converter until sufficient energy is stored in the rectifier capacitor.

Referring to FIG. 22A, boost converter 2200 comprises an input 2201 and an output 2208. In one embodiment, input 2201 is a rectified RF input. In one embodiment, the rectified RF input is a negative voltage that is produced by a rectifier (not shown in FIG. 22A to avoid obscuring the present invention) in which diodes are reversed in their position (flipped upside down) so that their conducting ground is to the negative voltage (instead of ground to positive).

Input 2201 is connected to a capacitor 2202 and a push button 2203. Capacitor 2202 is connected between input 2201 and ground. In one embodiment, capacitor 2202 is a 100 μf capacitor.

Push button 2203 is also coupled to a first winding of transformer 2204. In one embodiment, transformer 2204 is a Coilcraft LPR6235 transformer with 1:20 turns ratio. In one embodiment, the turns ratio is increased from 1:20 to 1:50, which increases the gain of the booster without introducing unacceptable losses. The other end of the first winding of transformer 2204 is connected to a drain of p-channel junction field-effect transistor (JFET) 2205. The source of transistor 2205 is connected to ground. The gate of transistor 2205 is connected to an end of the second winding of transformer 2204. In one embodiment, the gate of transistor 2205 is also coupled to capacitor 2206, which is also connected to ground. Note that capacitor 2206 is optional. In one embodiment, capacitor 2206 is a 100 pF capacitor. In one embodiment, transistor 2205 is a MMBJF201 transistor from Fairchild Semiconductor.

The other end of the second winding of transformer 2204 is connected to output 2208. Output 2208 is also connected to capacitor 2207, which is also connected to ground. In one embodiment, capacitor 2207 is a 0.1 μF capacitor. That is, capacitor 2207 is ¹⁄₁₀₀₀th of capacitor 2206.

In operation, at first, when the RF rectified input voltage is received, it charges up capacitor 2202. At this point, while charging up capacitor 2202, there is no current flowing through the first winding of transformer 2204 or through transistor 2205 as transistor 2205 is off.

When the charge on capacitor 2202 reaches a predetermined level, push button 2203 is activated and current starts to flow through the first winding of transformer 2204. In one embodiment, the booster begins to function when as low as 50 mV is available on capacitor 2202, so push button 2203 can be pressed at any time after the 50 mV point. Of course, the greater the voltage on capacitor 2202, the greater the boosted voltage output on capacitor 2207.

Once push button 2203 is pushed, the voltage of the first winding of transformer 2204 is transformed into a higher voltage on the second winding of transformer 2204. Capacitor 2207 and transformer 2204 form an LC resonant circuit. With ideal inductors and diodes, the magnetic field of the inductor is transferred to the electric field of the capacitor, and then back again. This would resonate indefinitely in an ideal case, building up voltage on capacitor 2207, provided there is enough startup energy in capacitor 2202. Also, in one embodiment, since the rectified input voltage is negative, the voltage at capacitor 2206 is positive.

But no actual electronic circuits are ideal; there are always losses. Therefore, eventually, the charge stored in capacitor 2202 depletes due to the transfer of boosted voltage energy into capacitor 2207, through transformer 2204 and the charging of capacitor 2207. At this point, the LC resonant oscillations stop, push button 2203 is closed, and capacitor 2202 returns to storing charge. Thereafter the process of storing and transferring charge repeats in the future. In one embodiment, the oscillations are on the order of 100 KHz, and they self resonate for 200-300 msec.

FIG. 22B is a circuit schematic of an alternative embodiment of a DC-DC boost converter. In one embodiment, the boost converter receives a negative voltage as an input, and switches the current through the transformer via a p-channel JFET in order to produce a positively-biased boosted voltage output.

The boost converter includes a pair of input capacitors 2212A-2212B which in one embodiment represents the capacitor of the first DC reservoir (e.g., reservoir 1702 of FIG. 17, initial reservoir capacitor 1802 of FIG. 18). In one embodiment, each of capacitors 2212A and 2212B is a 330 μF capacitor. In one embodiment, the capacitance of capacitors 2212A and 2212B is a large capacitance (e.g., greater than 100 μF). In one embodiment, the capacitance is increased from 100 μF to 660 μF, which increases the stored energy in a reasonable time frame. Note that the capacitance of capacitors 2212A and 2212B is about 6× the size of the input capacitor in FIG. 22A. In another embodiment, there is an output capacitor after the boost converter. This capacitor can be the same as the capacitor that is used as the charger input capacitor.

Referring to FIG. 22B, the boost converter comprises an input 2211 and an output 2218. In one embodiment, input 2211 is a rectified RF input. In one embodiment, the rectified RF input is a negative voltage that is produced by a rectifier (not shown in FIG. 22B to avoid obscuring the present invention) in which diodes are reversed in their position (flipped upside down) so that their conducting ground is to the negative voltage (instead of ground to positive).

Input 2211 is connected to a capacitors 2212A and 2212B and a push button 2213. Capacitors 2212A and 2212B are connected between input 2211 and ground.

Push button 2213 is also coupled to a first winding of transformer 2214. In one embodiment, transformer 2214 is a Coilcraft LPR6235 transformer with 1:50 turns ratio, which provides a higher multiplier than the transformer 2204 in FIG. 22A. The other end of the first winding of transformer 2214 is connected to a drain of p-channel junction field-effect transistor (JFET) 2215. The source of transistor 2215 is connected to ground. The gate of transistor 2215 is connected to an end of the second winding of transformer 2214. In one embodiment, the gate of transistor 2215 is also coupled to capacitor 2216, which is also connected to ground. Note that capacitor 2216 is optional. In one embodiment, capacitor 2216 is a 2 pF capacitor. In one embodiment, transistor 2215 is a MMBFJ720 transistor from Fairchild Semiconductor®.

The other end of the second winding of transformer 2214 is connected to output 2218. Output 2218 is also connected to capacitor 2217, which is also connected to ground. In one embodiment, capacitor 2217 is a 0.1 μF capacitor.

The detailed functionality of FIG. 22B is identical to that of FIG. 22A, so that description will not be repeated here, but the performance, due to the component value changes, is more efficient in FIG. 22B than 22A.

A Battery Charger Embodiment

In one embodiment, a battery charger is included to charge a rechargeable storage device. In one embodiment, the rechargeable storage device is a rechargeable battery. In one embodiment, where voltages are commonly less than 2V, a Nickel Metal Hydride (NiMH) battery is used as the rechargeable battery. NiMH batteries discharge at 1.5V and can be trickle-charged indefinitely, without concern for overcurrent or overcharging, at around 2.3V. Alternatively, a lithium battery can be used but is not ideal, because energy is lost both on boosting up to their terminal voltage, as well as regulating back down (assuming the sensor electronics are running at a nominal 1.8V or even lower) for the load. Thus, a battery charging system designed for NiMH batteries are therefore more efficient than lithium under these operating conditions.

It is assumed that the input energy is limited (Wi-Fi harvesting), so that the battery is not at risk of charging at a rate greater than one tenth of its capacity in mAh (called the C/10 rate). With a small 1.8 mAh button-cell-like battery, the charging current is less than 180 uA/hour.

In one embodiment, the battery charger includes an array, or group, of transistors to allow for the boost converter to build up the voltage to the charging circuit. Once the voltage has been built up, the energy is gated into the battery. In one embodiment, the gating is performed using a n-channel MOSFET. Thereafter, the cycle of waiting while the voltage builds up and then gating energy into the battery, which depletes the voltage build up, repeats all over again.

Similarly, the battery charger includes a number of diodes used can be selected to ensure the appropriate voltage build-up. For example, in one embodiment, the battery charger includes a pair of diodes, the cathode of the second which controls the gate of the first transistor in the array of transistors, and the pair of diodes connected into the gate of the first transistor are sized to ensure an appropriate voltage buildup after the boost converter. The number of diodes used determines the amount of voltage build-up, as a typical diode forward voltage drop is 1.4V. In FIG. 23A, a voltage of 1.4V is implemented.

In one embodiment, a diode is connected in series with the charging path (e.g., from the input of the battery charger to the positive terminal of the battery) to prevent back current from the battery to flow into the charge-detection circuitry (which may be part of the battery charger or may be part of a DC/DC boost converter). A final gate (e.g., a MOSFET) connects the battery ground to the charger ground, thus allowing current flow into the battery. Alternatively, p-channel MOSFET can be used to switch the power into the battery.

Thus, in one embodiment, the novel charger design is optimized to the needs of a NiMH charging system, enabling trickle-charging without requiring a complex charge management system as is typical for lithium or lithium polymer batteries.

Because a NiMH battery is used, there is no need for a down converter on the load nor a charge counter that is used with Lithium batteries to count the amount of energy that has been stored.

FIG. 23A is a circuit schematic of one embodiment of a battery charger. Referring to FIG. 23A, battery input 2301 is connected to the input of diode 2302 and a pair of cascade connected diodes 2303 and 2304. The cathode of diode 2302 is connected to the positive ("+") terminal of battery 2320.

The cathode of diode 2304 is connected to capacitor 2305, which is connected to ground. In one embodiment, capacitor 2305 is a 0.01 uF capacitor. The input of diode 2306 is connected ground and the output of diode 2306 is connected to a node connecting the output of diode 2304 and capacitor 2305.

The gate of transistor 2307 is also connected to the node connecting the output of diode 2304 and capacitor 2305. In one embodiment, transistor 2307 is a n-channel MOS field-effect transistor. The source of transistor 2307 is connected to ground, while the drain of transistor 2307 is connected to one end of resistors 2308 and 2309. In one embodiment, resistors 2308 and 2309 are 10K Ohm and 100 K Ohm, respectively.

The other end of resistor 2308 is connected to the + terminal of battery 2320, forming a self-powered pull-up resistor. The other end of resistor 2309 is connected to capacitor 2313, which is also connected to ground, and the gate of transistor 2310. In one embodiment, transistor 2310 is an n-channel MOS field-effect transistor (MOSFET). In one embodiment, capacitor 2313 is a 0.1 uF capacitor. Resistor 2309 and capacitor 2313 form an RC time delay circuit, allowing further build-up of energy before charging the battery.

The source of transistor 2310 is connected to ground while its drain is connected to one end of resistor 2311 and the gate of transistor 2312. In one embodiment, resistor 2311 is 10K Ohm. The other side of resistor 2311 is connected to the + terminal of battery 2320, again forming a pull-up resistor. The source of transistor 2312 is connected to ground while its drain is connected to the negative ("−"), or ground, terminal of battery 2320.

In operation, the connection to battery 2320 is normally an open circuit. The connection to battery 2320 is made when a charge pulse is to be stored in battery 2320. The negative terminal of battery 2320 is connected to ground when transistor 2312 is turned on.

Transistors 2307 and 2310, in combination with diodes 2303 and 2304, are used to hold off and wait for the voltage to reach a particular level before putting the voltage into energy storage. Diodes 2303 and 2304 force two diode drops onto the gate of transistor 2307. When the voltage is high enough, transistor 2307 turns on. Once transistor 2307 turns on, there is a predetermined period of time before transistor 2310 turns on. This is due to the RC time constant associated with the RC circuit consisting of resistor 2309 and capacitor 2313. Once transistor 2310 turns on, then transistor 2312 turns on, thereby causing the battery to charge.

When the voltage on the input from the boost converter drops to a level at which transistor 2307 turns off, because the energy has been transferred into the battery, then transistor 2310 turns off after the delay due to the RC circuit, thereby causing transistor 2312 to turn off. At this point, the charging of battery 2320 stops.

Note that transistor 2310 acts an inversion transistor to change the polarity of the signal on the gate of transistor 2312, so that it turns on with the appropriate polarity. Note that some of the energy stored in capacitor 2305 is used to turn on the gate of transistor 2307.

Pull-up resistors 2309 and 2311 are used to control the gates of transistors 2310 and 2312 respectively. Specifically, these resistors provide a defined logic level for the gates of transistors 2307 and 2310 off when the voltage level at the input of the boost converter drops to a particular level.

Diode 2306 is used for stabilization by bring stability to the gate of transistor 2307 to compensate for oscillation that occurs on the node connecting the output of diode 2304 and the gate of transistor 2307, and it also prevents over-voltage build-up on that node.

Diode 2302 is connected in series between input 2301 and the + terminal of battery 2320 to prevent back current from the battery to flow in the opposite direction.

FIG. 23B is a circuit schematic of an alternative embodiment of a battery charger for a similar type of battery system as FIG. 22B. The battery charger of FIG. 23B uses p-channel MOSFETs to switch energy directly into the battery terminal, as well as high-switching speed n-channel MOSFETs in the control section to reduce leakage during the gate transition range because of slow edge rates.

Referring to FIG. 23B, the battery charger includes a battery charger input 2330, a battery charger output at battery 2334, transistors 2331-2333, 2336 and 2337, capacitors 2341, 2342 and 2351, and resistors 2361-2365. Transistor 2336 is directly in parallel with transistor 2332, and transistor 2373 is directly in parallel with transistor 2333. In one embodiment, transistors 2332 and 2333 are used and 2336 and 2337 are not used. In another embodiment, these can be reversed. The difference here is different packages for different types of transistors. Transistors 2336 and 2337 are 3-pin parts, while 2332 and 2333 are 8-pin parts. In the discussion that follows, transistors 2332 and 2333 will be used.

Battery charger input 2330 is coupled to the positive ("+") terminal of the battery at battery charger output 2334 via transistors 2332 and 2333. In operation, the connection to the battery at battery 2334 is normally not connected. The connection to battery 2334 is made when a charge pulse is to be stored in the battery. The positive terminal of the battery 2334 is connected to the charged energy at input 2330. When p-channel MOSFET transistors 2332 and 2333 are on, energy flows into the battery.

Battery charger input 2330 is also connected to the gate input of transistor 2331. Transistor chip 2331 is a sub-threshold n-channel MOSFET chip that includes a pair of n-channel transistors. The first of these transistors turns on when the voltage on its gate input (GN1) is at or above a predetermined level. In one embodiment, transistor 2331 is an ALD110914 transistor from Advanced Linear Devices that turns on when the voltage on its gate is 1.4 v.

When the first of the transistors of transistor chip 2331 turns on, its drain output (DN1) is pulled down (because it is now conducting to the source S12 which is ground). The drain output DN1 of the first transistor in transistor chip 2331 is coupled to the gate of transistor 2332, and because transistor 2332 is a p-channel MOSFET, when its gate is low, transistor 2332 turns on. When transistor 2332 turns on, the voltage from battery charger input 2330 passes through transistor 2332 and causes a signal from feedback 2370, which is coupled to the gate input (GN2) of the second transistor of transistor chip 2331, to be received by the gate input GN2 and after a delay the voltage reaches high enough to turn on that second transistor.

When the second of the transistors of transistor chip 2331 turns on, its drain output (DN2) is pulled down (because it is now conducting to the source S12 which is ground). The drain output DN2 of the second transistor in transistor chip 2331 is coupled to the gate of transistor 2333 and similarly to transistor 2332, because transistor 2333 is a p-channel MOSFET, when its gate is low, transistor 2333 turns on. At this point, since both transistors 2332 and 2333 are on, the voltage from battery charger input 2330 charges the battery 2334.

Thus, the voltage from battery charger input 2330 controls transistor chip 2331, which in turn controls transistors 2332 and 2333, to cause the battery at battery output 2334 to be charged.

Resistors 2361 and 2362 are pull-up resistors that are designed to provide a bias to the drains of both transistors in 2331, to keep transistors 2332 and 2333 off while the drain outputs DN1 and DN2, respectively, are high (because the two transistors in transistor chip 2331 are off).

Resistor 2363 is used to weakly discharge any remaining voltage on battery charger input 2330 when the booster circuit (e.g., FIG. 22A, FIG. 22B, etc.) is not outputting a voltage into battery charger input 2330, to prevent a brown-out startup condition in the booster circuit.

In one embodiment, resistors 2364 and 2365 are 0-ohm resistors and are direct electrical shorts. Their presence allows for easy access to probe and debug the charger circuit, but they are not required.

Capacitor 2351 is coupled to the output to provide DC stability. In one embodiment, capacitor 2351 is a 230 pF capacitor.

Capacitors 2340 and 2341 are used to adjust the timing of when the gates of transistors 2332 and 2333 are at a low enough voltage to turn on by slowing down their falling edge. This is because the pull-up transistors 2361 and 2362 in combination with the voltage source VBAT cause capacitors 2340 and 2341 to be charged up at the time when the transistors of transistor chip 2331 turn on. This charge will drain slowly and the delay caused by the draining of these capacitors allows more energy to build up prior to transistors 2332 and 2333 from both being turned on. In one embodiment, capacitor 2340 is a 0.001 µF capacitor, and capacitor 2341 is a 0.1 µF capacitor.

Diode 2380 is used to prevent current backflow from the battery into the charger circuit when the circuit is idle (i.e., when waiting for harvested energy to build up before the booster circuit).

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. A radio-frequency (RF) sensor comprising:
   an energy harvesting unit operable to convert incident RF energy to direct current (DC);
   a storage unit operable to store recovered DC power;
   one or more sensors for sensing;
   a backscatter communication interface to backscatter energy to communicate one or more packets using frequency-shift keying (FSK) modulation, wherein the backscatter communication interface comprises a frequency synthesizer, a multiplexer, and a RF switch, and further wherein outputs of the frequency synthesizer are coupled to inputs of the multiplexer and an output of the multiplexer is coupled to an input of the RF switch, the RF switch to output data for transmission; and
   a microcontroller coupled to the energy harvesting and storage units, the one or more sensors, and the backscatter communication interface, the microcontroller operable to cause the backscatter communication interface to communicate sensed data from at least one of the one or more sensors while powered by energy previously harvested by the energy harvesting unit and stored by the storage unit.

2. The RF sensor defined in claim 1 wherein the one or more packets comprise one or more BLE advertising packets.

3. The RF sensor defined in claim 1 wherein the backscatter communication interface comprises a waveform generator.

4. The RF sensor defined in claim 1 wherein the microcontroller is operable to generate a control signal to control the multiplexer.

5. The RF sensor defined in claim 4 wherein the multiplexer comprises a 2:1 or 4:1 multiplexer.

6. The RF sensor defined in claim 1 wherein the backscatter communication interface comprises a PLL device that shifts between two frequencies.

7. The RF sensor defined in claim 1 wherein the backscatter communication interface transmits a plurality of messages in a plurality of bursts, wherein each of the plurality of bursts is separated by a first time delay that is different than a second delay between pulses of a BLE advertising packet.

8. The RF sensor defined in claim 1 wherein the backscatter communication interface is operable to employ retry timing with a retry delay based on a received signal strength indicator (RSSI) stored in an RF sensor memory.

9. The RF sensor defined in claim 1 wherein the backscatter communication interface transmits Bluetooth packets on channels other than BLE advertising channels.

10. The RF sensor defined in claim 1 further comprising a directional antenna or beam steering for use in energy harvesting and for message transmission.

11. The RF sensor defined in claim 1 further comprising a receiver to receive information for the purposes of configuring the sensor, controlling the sensor, sending an acknowledgement to the sensor, running diagnostics on the sensor, or re-programming the sensor.

12. A radio-frequency (RF) sensor comprising:
   an energy harvesting unit operable to convert incident RF energy to direct current (DC);
   a storage unit operable to store recovered DC power;

one or more sensors for sensing;

a backscatter communication interface to backscatter energy to communicate using one or more BLE advertising packets, wherein the backscatter communication interface comprises a RF switch to output data for transmission in response to each of a plurality of waveform signals applied to an input of the RF switch individually based on a selection signal; and a microcontroller coupled to the energy harvesting and storage units, the one or more sensors, and the backscatter communication interface, the microcontroller operable to cause the backscatter communication interface to communicate sensed data from at least one of the one or more sensors while powered by energy previously harvested by the energy harvesting unit and stored by the storage unit.

13. The RF sensor defined in claim 12 wherein the backscatter communication interface backscatters energy to communicate using frequency shift keying.

14. The RF sensor defined in claim 12 wherein the multiplexer comprises a 2:1 or 4:1 multiplexer.

15. The RF sensor defined in claim 12 wherein the backscatter communication interface is operable to employ retry timing with a retry delay based on a received signal strength indicator (RSSI) stored in an RF sensor memory.

16. The RF sensor defined in claim 12 further comprising a directional antenna or beam steering for use in energy harvesting and for message transmission.

17. The RF sensor defined in claim 12 further comprising a receiver to receive information for the purposes of configuring the sensor, controlling the sensor, sending an acknowledgement to the sensor, running diagnostics on the sensor, or re-programming the sensor.

18. A method comprising:

converting, on a radio-frequency (RF) sensor, incident RF energy to direct current (DC);

storing, on the RF sensor, DC power resulting from converting the incident RF energy to the DC; and communicating one or more packets of data from the RF sensor via backscatter energy using a frequency-shift keying (FSK) modulator while powered by energy previously harvested and stored by the RF sensor, including generating at least two waveforms and selecting one of the at least two waveforms for output from a multiplexer for use by a backscatter modulator to generate backscatter communications.

19. The method defined in claim 18 wherein the one or more packets comprise one or more BLE advertising packets.

20. The method defined in claim 18 wherein communicating the one or more packets comprises:

generating an output waveform from a waveform generator; and modulating continuous wave energy associated with the output waveform for backscatter communication using an RF switch.

\* \* \* \* \*